United States Patent
Arao et al.

(10) Patent No.: US 6,828,584 B2
(45) Date of Patent: Dec. 7, 2004

(54) SEMICONDUCTOR DEVICE AND METHOD FOR MANUFACTURING THE SAME

(75) Inventors: Tatsuya Arao, Kanagawa (JP); Yoshifumi Tanada, Kanagawa (JP); Hiroshi Shibata, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 210 days.

(21) Appl. No.: 10/151,005

(22) Filed: May 17, 2002

(65) Prior Publication Data

US 2002/0195603 A1 Dec. 26, 2002

(30) Foreign Application Priority Data

May 18, 2001 (JP) ........................... 2001-149290

(51) Int. Cl.[7] .............................................. H01L 29/04
(52) U.S. Cl. ............................... 257/57; 257/59; 257/72; 257/350
(58) Field of Search ................................ 257/57, 59, 72, 257/350

(56) References Cited

U.S. PATENT DOCUMENTS

| | | | | |
|---|---|---|---|---|
| 5,499,123 A | 3/1996 | Mikoshiba | .................. | 359/59 |
| 6,531,713 B1 * | 3/2003 | Yamazaki | .................. | 257/59 |
| 2001/0030322 A1 | 10/2001 | Yamazaki et al. | ............ | 257/59 |
| 2001/0030860 A1 | 10/2001 | Kimura et al. | ............... | 362/31 |
| 2001/0035526 A1 | 11/2001 | Yamazaki et al. | ............ | 257/31 |
| 2001/0041392 A1 | 11/2001 | Suzawa et al. | ............. | 438/149 |
| 2001/0054999 A1 | 12/2001 | Azami | ........................ | 345/100 |
| 2002/0013022 A1 | 1/2002 | Yamazaki et al. | ........... | 438/166 |
| 2002/0027247 A1 | 3/2002 | Arao et al. | ................. | 257/347 |
| 2002/0028544 A1 | 3/2002 | Fujimoto et al. | ........... | 438/166 |

FOREIGN PATENT DOCUMENTS

| | | |
|---|---|---|
| JP | 5-275456 | 10/1993 |
| JP | 8-211406 | 8/1996 |
| JP | 9-008312 | 1/1997 |
| JP | 10-270363 | 10/1998 |

* cited by examiner

Primary Examiner—Edward Wojciechowicz
(74) Attorney, Agent, or Firm—Cook, Alex, McFarron, Manzo, Cummings & Mehler, Ltd.

(57) ABSTRACT

It is a problem to realize, by a reduced number of processes than that of the conventional, a reliable active-matrix liquid crystal display device having a high opening ratio for high-definition display. The present invention is characterized by: forming a gate electrode and source and drain interconnections in the same process, forming a first insulating film covering the interconnections, forming an upper light-shielding film on the first insulating film, forming a second insulating film on the upper light-shielding film, partially etching the first and second insulating films to form a contact hole reaching the drain interconnection, and forming a pixel electrode on the second insulating film to connect to the drain interconnection. Meanwhile, a holding capacitance is formed by the upper light-shielding film, the second insulating film and the pixel electrode.

16 Claims, 15 Drawing Sheets

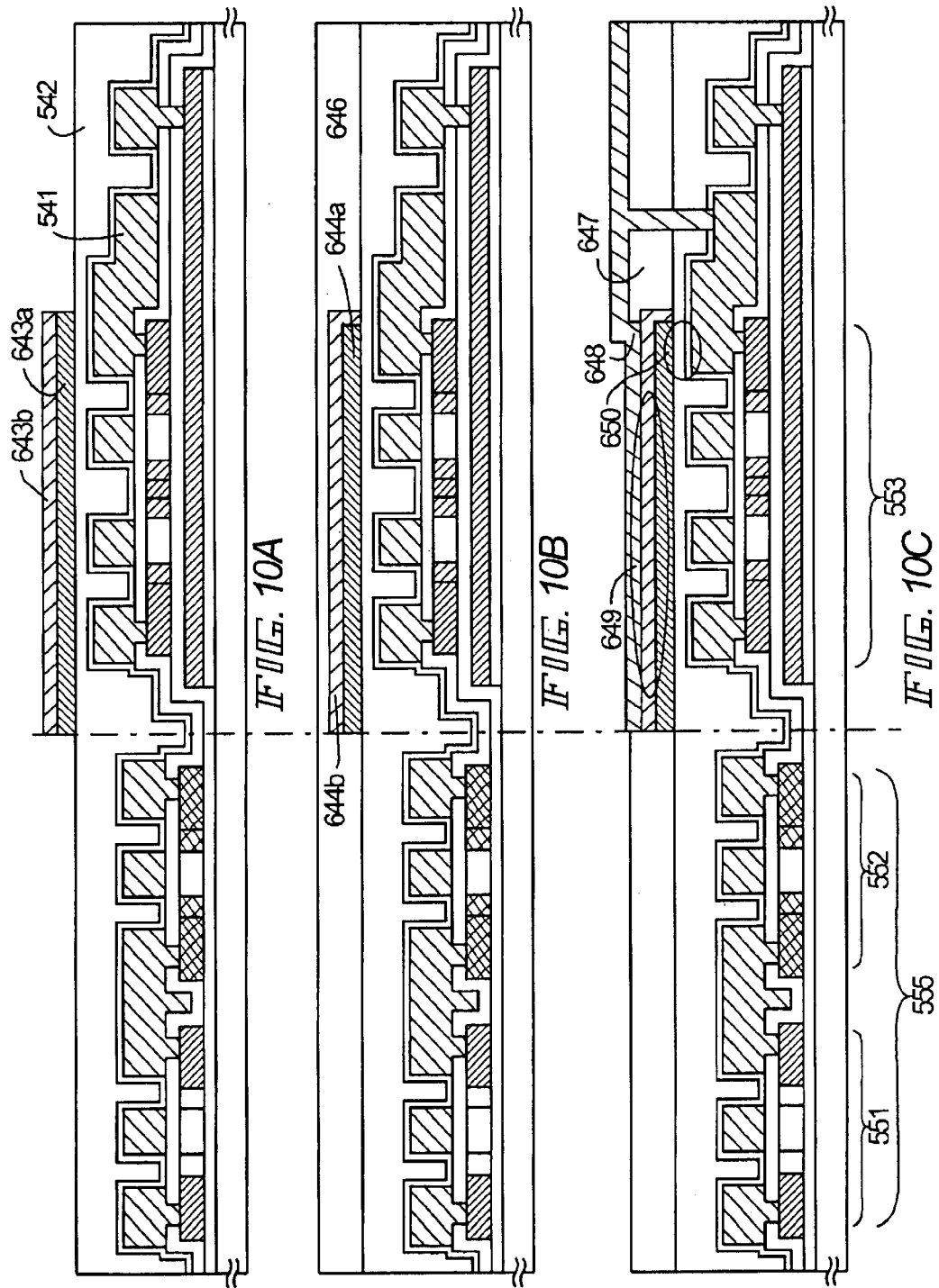

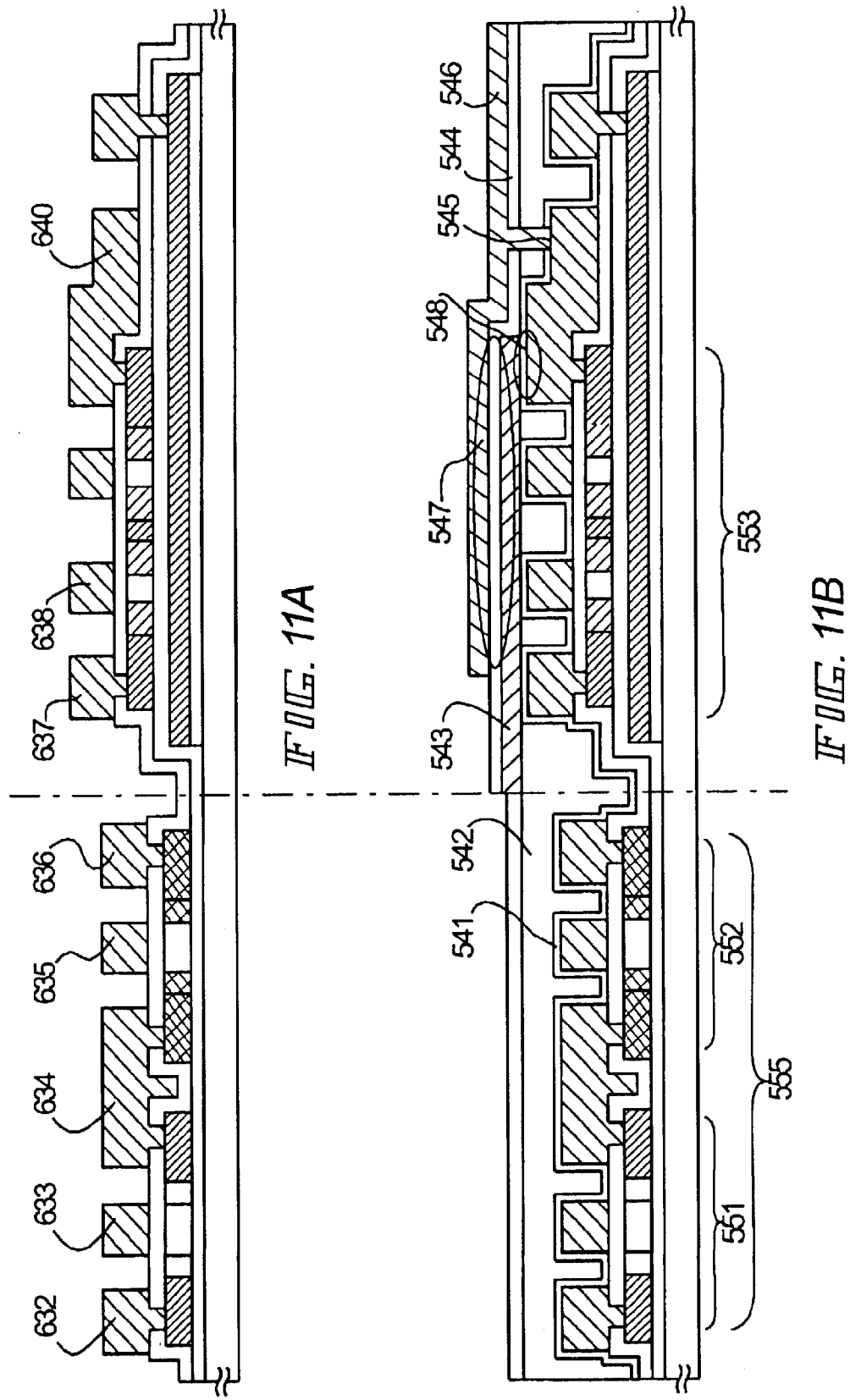

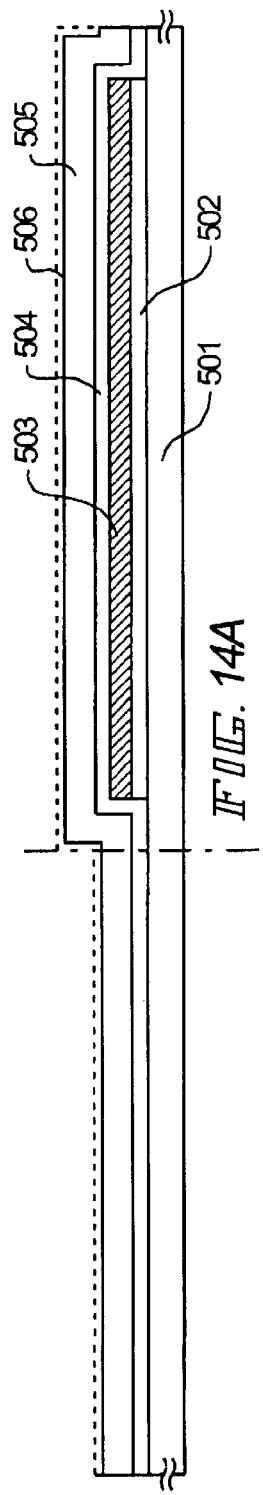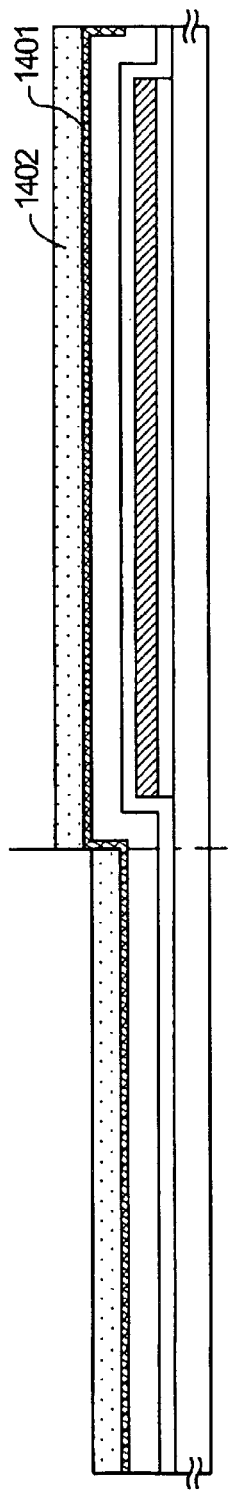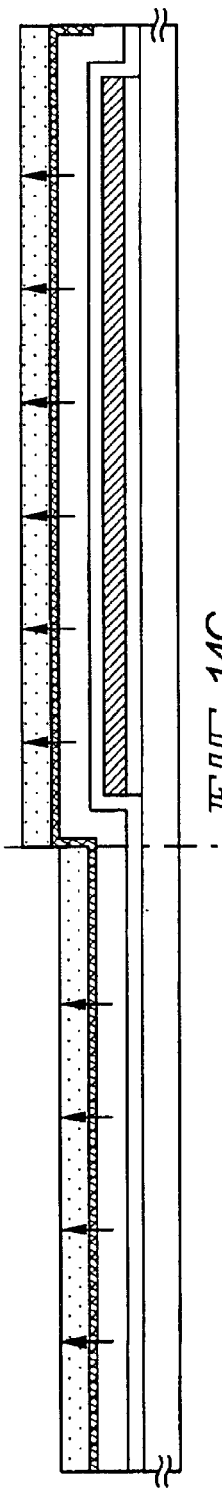

SEMICONDUCTOR DEVICE AND METHOD FOR MANUFACTURING THE SAME

BACKGROUND OF THE INVENTION

1. Field of the Invention

The present invention relates to a semiconductor device having a circuit structured with thin film transistors (hereinafter, referred to as TFTs) and to a method for manufacturing the same. Particularly, the invention relates to an electro-optical device represented by the liquid crystal display panel and an electronic appliance mounted with such an electro-optical device as a part. Incidentally, in this description, the semiconductor device refers to the devices in general capable of functioning by the utilization of a semiconductor characteristic, i.e. an electro-optical device, a semiconductor circuit and an electronic appliance, in any, are fallen under a semiconductor device.

2. Description of the Prior Art

Recently, development has been proceeded for semiconductor devices having TFTs structured by using a thin film (thickness: approximately several to several hundred nm) formed on a substrate having an insulating surface to have a large-area integrated circuit forming TFTs. There is known an active-matrix liquid crystal display device as a representative example. In particular, the TFT using a crystalline silicon film in its active region is allowed to form various functional circuits because of its high electric-field mobility.

For example, the active-matrix liquid crystal display is formed, for each functional block, with a pixel circuit for image display, a shift register circuit based on a CMOS circuit, such driver circuits for controlling the pixel circuit as a level shifter circuit, a buffer circuit and a sampling circuit, on one substrate.

The TFT has, at least, a semiconductor film, an insulating film such as a silicon oxide film or a silicon oxide nitride film, an interconnections of various metal materials or the like, and a pixel electrode. The interconnections include a source interconnection and a gate interconnection (including a gate electrode). The source interconnection and the source electrode connected to the source region, in many cases, are connected through the other interconnection.

Meanwhile, of among the active-matrix liquid crystal displays, the liquid crystal projectors using small-sized liquid crystal panels have being spread at a rapid pace to broaden the field of use. Due to this, there are demands for convenience. Development has being continued in order to advance size reduction, brightness increase, definition enhancement and price reduction.

The active-matrix liquid crystal display, used in a liquid crystal projector or electronic apparatus display, has a pixel region structured with several million pixels. Each pixel is formed with a TFT, and the TFT of each pixel has a pixel electrode. A counter electrode is provided on the counter substrate sandwiching a liquid crystal, to form a kind of capacitor having a liquid crystal as a dielectric. The potential to be applied to each pixel is controlled under TFT switching function to control the charge to the capacitor. Thus, the liquid crystal is driven to control the amount of transmission light thereby displaying images.

Because the capacitor gradually decreases in its capacitance due to current leakage, it forms a cause to vary the amount of light transmission and hence decrease the contrast in image display. For this reason, in the conventional, there has been provided a capacitance interconnection to provide, in parallel, a capacitor (holding capacitance) separately from the capacitor having a liquid crystal as a dielectric. The holding capacitance serves to supplement a capacitance lost by the capacitor having a liquid crystal as a dielectric.

However, when trying to form, in the pixel region, a holding capacitance using a capacitance interconnection and secure a sufficient capacitance, the opening ratio must be sacrificed. Particularly, it is to be fully expected that pixel size reduction be continued for the small-sized high-definition liquid crystal display as used in the liquid crystal projector, as long as definition enhancement is sought together with size reduction. For example, in order to realize display with definition as high as XGA (1024×768 pixels) on a liquid crystal display of a diagonal 0.7-inch type, each pixel has an area of as small as 14 $\mu$m×14 $\mu$m. Meanwhile, even in the case of providing a contact hole with an area of 1-$\mu$m square, the contact must be secured with an area of 3-$\mu$m square by extending one side at least by 1-$\mu$m each if considering a problem with coverage or the like. In the case of 14 $\mu$m on one side of one pixel, when a 3-$\mu$m-square contact is formed one, the opening ratio is lowered at least 4.6%. The number of contacts is of a significantly important problem amid the continuing pixel size reduction.

At present, brightness increase is coped with by increasing the opening ratio while definition enhancement is by increasing the number of pixels. However, amid continuing pixel size reduction, there is an extremely difficult problem in simultaneously satisfying the improvement in opening ratio and the increase in the number of pixels while designing a pixel structure with a sufficient capacitance secured. When trying to realize such a pixel structure, the number of processes naturally increases to make the process complicate. This results in a problem of worsened yield and semiconductor-device manufacture cost increase.

Meanwhile, there are cases that light leak current increases due to the light coming at a surface of a substrate not formed with TFTs of a light-transmission liquid crystal display or the light incident upon a top surface and irregularly reflected in the substrate, thus increasing an off-current (drain current flowing in a TFT off-state). The increase in leak current requires an increase of holding capacitance for compensation, causing a problem of lowering in opening ratio in the pixel region.

The present invention is an art for resolving the foregoing problem, and it is a problem to realize, by a reduced number of processes as compared to the conventional in respect of the structure of TFT and holding capacitance, a reliable active-matrix liquid crystal display device having a high opening ratio to make a display with definition. Meanwhile, it is a problem to realize high-definition image display even in a liquid crystal display device designed with a pixel size as small as ten and several $\mu$m square and in an electronic apparatus using, in a display part, such liquid-crystal display device.

SUMMARY OF THE INVENTION

The present invention is characterized by: forming a gate electrode and source and drain interconnections in the same process, forming a first insulating film covering the gate electrode, the source and drain interconnections, forming an upper light-shielding film on the first insulating film, forming a second insulating film on the upper light-shielding film, partially etching the first and second insulating films to form a contact hole reaching the drain interconnection, and forming a pixel electrode on the second insulating film to connect to the drain interconnection. Meanwhile, holding capacitances are formed by the drain interconnection, the first insulating film and the upper light-shielding film as well as the upper light-shielding film, the second insulating film and the pixel electrode.

Meanwhile, the TFT has a semiconductor film including a channel region and source and drain regions, a gate insulating film and a gate electrode. The gate electrode is connected to a gate interconnection serving also as a lower light-shielding film formed in a lower level than the semiconductor film (close to the substrate).

In this manner, because the gate electrode and the source and drain interconnections are formed in the same process, the number of processes can be reduced. Specifically, reduced is the number of photo-masks required in fabricating TFTs. The photo-mask is used, in a photolithographic technique, to form a resist pattern mask on a substrate during an etching process. Consequently, the use of one photo-mask signifies an addition of the processes of resist stripping, cleaning and drying in the process of before or after the same, besides film deposition and etching, wherein trouble processes including resist application, pre-bake, exposure, development and post-baking are to be carried out in the photolithography process.

Meanwhile, by forming a gate electrode and source and drain interconnections in the same process, it is possible to reduce the number of levels as compared to that of the conventional. Due to this, the physical distance is decreased between the semiconductor film and the light-shielding film, thus making possible to prevent against the occurrence of current leakage due to light leak or diffraction.

Meanwhile, the direct connection between the source interconnection and the source region makes it possible to reduce the number of contacts and improve the opening ratio. Amid continuing pixel size reduction, it is very effective to reduce the number of contact holes to a possible extent in order for improving the opening ratio.

Meanwhile, by forming holding capacitances by the drain interconnection, the first insulating film and the upper light-shielding film as well as the upper light-shielding film, the second insulating film and the pixel electrode, a sufficient holding capacitance can be secured. The holding capacitance can be further made sufficient by making the first and second insulating films to films having a high dielectric constant or in a possibly small thickness.

A manufacturing method, disclosed in the present description, comprises: forming a first light-shielding film on an insulating surface; forming an underlying insulating film on the first light-shielding film; forming a semiconductor film over the first light-shielding film through the underlying insulating film; selectively introducing an impurity element to the semiconductor film to form a source region and a drain region; forming a first insulating film on the semiconductor film; partly etching the first insulating film to expose a part of the first light-shielding film, source region and drain region; forming a conductive film on the first insulating film; etching the conductive film to form a gate electrode, a source interconnection and a drain interconnection; forming a second insulating film contacted with the first insulating film, the gate electrode, the source interconnection and the drain interconnection; forming a second light-shielding film overlapping the first light-shielding film on the second insulating film; forming a third insulating film covering the second light-shielding film; partly etching the third insulating film to expose a part of the drain interconnection to form a pixel electrode.

In the manufacturing method, the material for forming a conductive film uses a heat-resistive conductive material and may be, typically, an element selected from Ta, W, Ti, Mo, Cu, Cr and Nd, or an alloy material or compound material based on the element. Meanwhile, may be used a semiconductor film represented by a crystalline silicon film introduced with an impurity element, such as phosphorus. Meanwhile, an AgPdCu alloy may be used. The conductive film may be not a single-layer but a layered structure having two or more layers, or may be a structure having a low-heat-resistive conductive material sandwiched by high-heat-resistive conductive materials.

In the manufacturing method, the impurity element is one or a plurality of elements selected from n-type-providing impurity elements and p-type-providing impurity elements.

Meanwhile, a semiconductor device manufactured by the manufacturing method is a semiconductor device comprising: a gate electrode formed over a semiconductor film through a first insulating film and source and drain interconnections connected to the semiconductor film being formed of a same conductive material; a holding capacitance formed by the gate electrode, a light-shielding film formed on the source and drain interconnections through a second insulating film, a third insulating film formed on the light-shielding film, and a pixel electrode formed on the third insulating film and electrically connected to the drain interconnection.

Meanwhile, another semiconductor device manufactured by the manufacturing method is a semiconductor device comprising: a gate electrode formed over a semiconductor film through a first insulating film and source and drain interconnections connected to the semiconductor film being formed of a same conductive material; a first holding capacitance formed by the gate electrode, a light-shielding film formed on the source and drain interconnections through a second insulating film, a third insulating film formed on the light-shielding film, and a pixel electrode formed on the third insulating film and electrically connected to the drain interconnection; and a second holding capacitance formed by the drain interconnection, the second insulating film and the light-shielding film.

In the semiconductor device, the material for forming a conductive film uses a heat-resistive conductive material and may be, typically, an element selected from Ta, W, Ti, Mo, Cu, Cr and Nd, or an alloy material or compound material based on the element. Meanwhile, may be used a semiconductor film represented by a crystalline silicon film introduced with an impurity element, such as phosphorus. Meanwhile, an AgPdCu alloy may be used. The conductive film may be not a single-layer but a layered structure having two or more layers, or may be a structure having a low-heat-resistive conductive material sandwiched by high-heat-resistive conductive materials.

In this manner, by forming a gate electrode and source and drain interconnections in the same process, it is possible to reduce the number of levels as compared to that of the conventional. Thus, yield is improved and semiconductor-device manufacturing cost is reduced. Meanwhile, because the number of levels can be decreased, the physical distance is decreased between the semiconductor film and the light-shielding film, thus making possible to prevent against the occurrence of current leakage due to light leak or diffraction. Furthermore, the direct connection between the source interconnection and the source region makes it possible to reduce the number of contacts and improve the opening ratio. Meanwhile, sufficient holding capacitance can be secured by forming holding capacitances by the drain interconnection, the interlayer insulating film and upper light-shielding film as well as the upper light-shielding film, the first insulating film and the pixel electrode.

Meanwhile, another structure of the invention is a semiconductor device having a pixel region and drive circuit on an insulating surface, the semiconductor device comprising:

in a TFT in the pixel region, a first gate electrode formed over a first semiconductor film through a first insulating film and first source and drain interconnections connected to the semiconductor film being formed of a same conductive material;

the first gate electrode being connected to a lower light-shielding film formed of conductive materials, formed beneath the semiconductor film; and a holding capacitance formed by the first gate electrode, an upper light-shielding film formed on the first source and drain interconnections through a second insulating film, a third insulating film formed on the upper light-shielding film, and a pixel electrode formed on the third insulating film and electrically connected to the drain interconnection; and in a TFT in the drive circuit, a second gate electrode formed over a second semiconductor film through a first insulating film and second source and drain interconnections connected to the semiconductor film being formed of a same conductive material; and an interconnection formed of the same material as the lower light-shielding film being connected to the second gate electrode.

Meanwhile, in the above structure, the TFTs formed on the insulating film may all be n-channel TFTs or p-channel TFTs. Also, in the structure, the lower light-shielding film is at the beneath of a first semiconductor film of a pixel TFT, an interconnection same in material as the lower light-shielding film provided in the drive circuit is an extended line not to cross over with a second source interconnection or second drain interconnection (gate connected to the second gate electrode).

BRIEF DESCRIPTION OF THE DRAWINGS

FIGS. 10A–10C are sectional views showing a manufacturing process of a pixel TFT and drive-circuit TFT;

FIGS. 11A and 11B are sectional views showing the manufacturing process of a pixel TFT and drive-circuit TFT;

FIGS. 14A–14C are views showing Embodiment 6; and

DETAILED DESCRIPTION OF THE PREFERRED EMBODIMENTS

Figure 1:
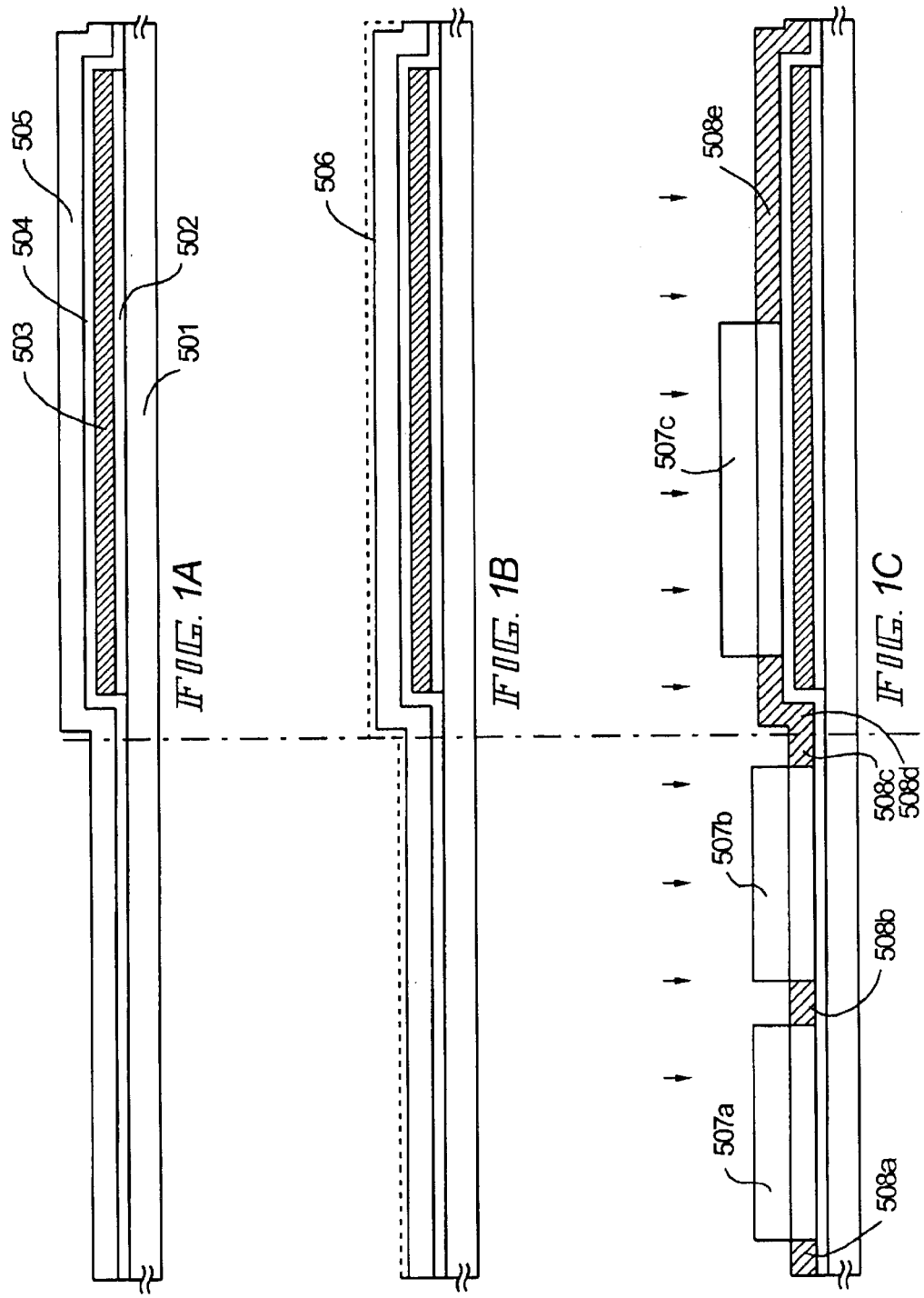
FIGS. 1A–1C are sectional views showing a manufacturing process of a pixel TFT and drive-circuit TFT.
Figure 2:
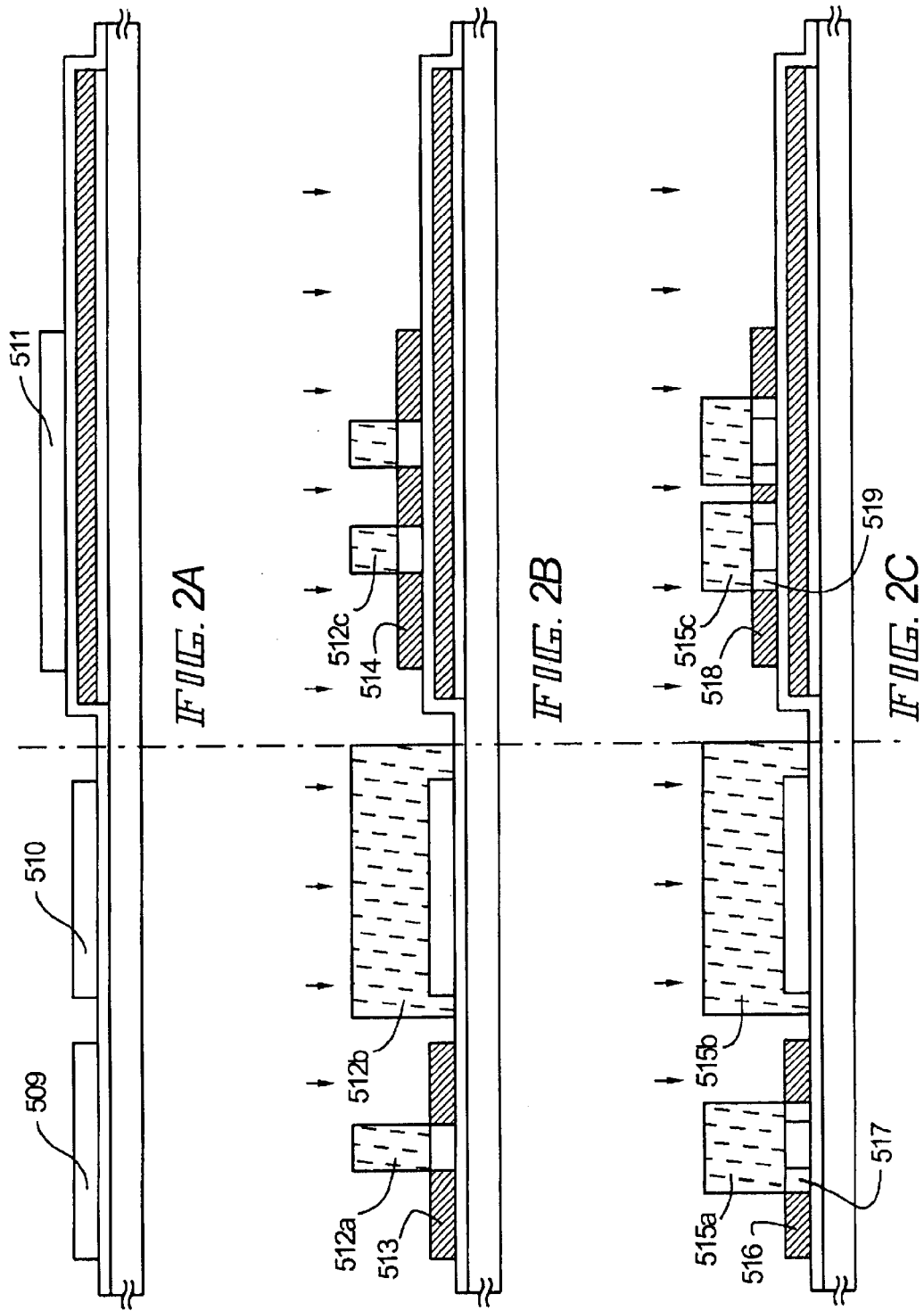
FIGS. 2A–2C are sectional views showing the manufacturing process of a pixel TFT and drive-circuit TFT.
Figure 3:
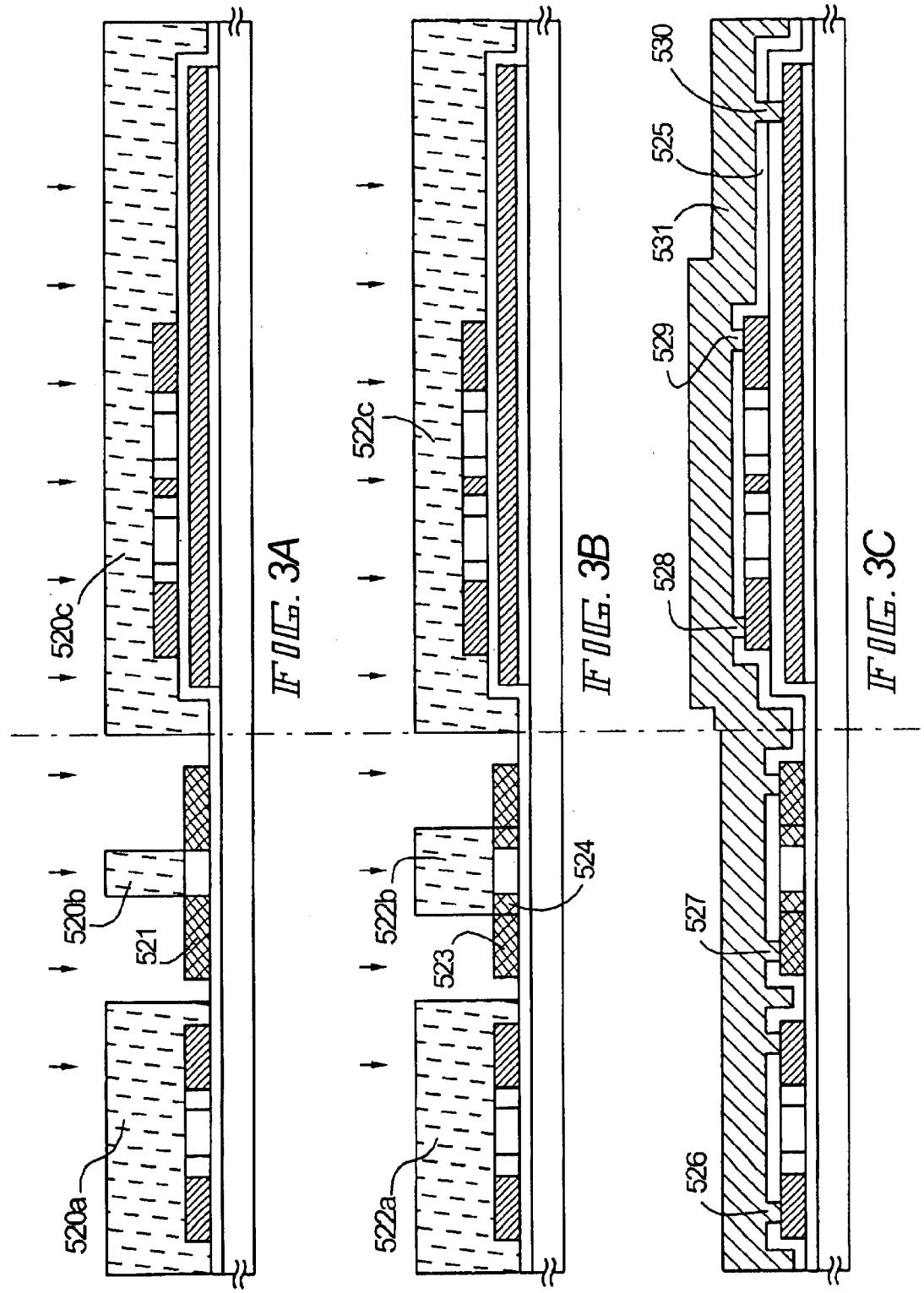
FIGS. 3A–3C are sectional views showing the manufacturing process of a pixel TFT and drive-circuit TFT.
Figure 4:
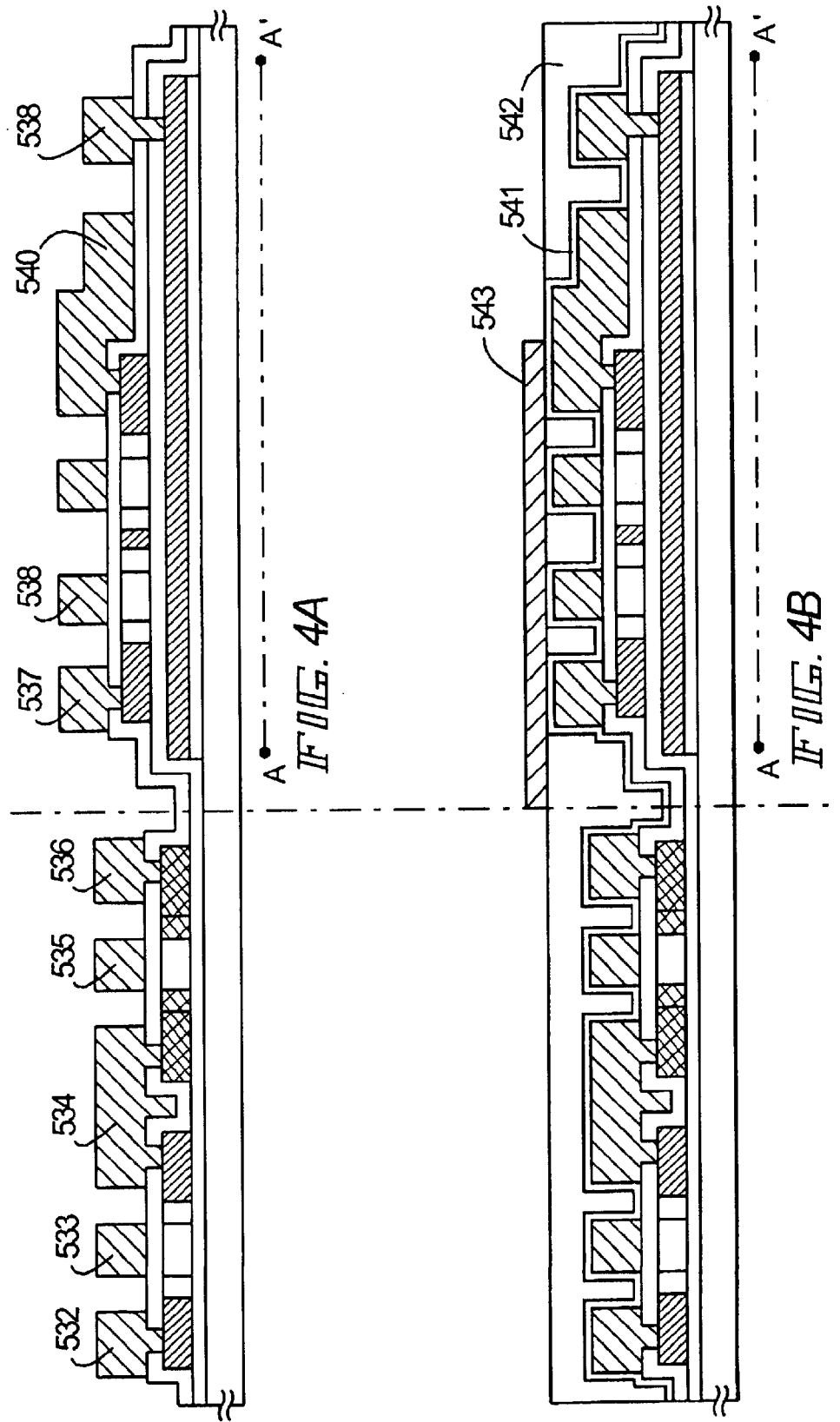
FIGS. 4A and 4B are sectional views showing the manufacturing process of a pixel TFT and drive-circuit TFT.

The pixel structure of the present invention will now be explained with using a sectional view of FIG. 5.

Light-shielding films 502 and 503, serving also as gate interconnections, is formed over a substrate 501. On the gate interconnection 503, an underlying insulating film 504, a semiconductor layer 511 and a gate insulating film 525 are formed in this order. A gate electrode 538 on the gate insulating film 525 is connected to the gate interconnection 503. A source interconnection 537 and a drain interconnection 540 are respectively connected to impurity regions of the semiconductor layer 511. On the gate electrode 538, source interconnection 537 and drain interconnection 540, a first interlayer insulating film 541 and a second interlayer insulating film 542 are layered, to form an upper light-shielding film 543 on the second interlayer insulating film 542 for a TFT (particularly, channel region). A third interlayer insulating film 544 is formed on the upper light-shielding film 543. A pixel electrode 546 is formed on the third interlayer insulating film 544.

The gate electrode 538, the source interconnection 537 and the drain interconnection 540 are characterized in that they are formed in the same process. This realizes the reduction of the number of processes. Meanwhile, the direct connection between the source electrode and the source region reduces the number of contact holes, making possible to improve the opening ratio in fabricating a liquid crystal display device.

The pixel structure, in the disclosure of the invention, has the lower light-shielding films (gate interconnection) 502 and 503 and the upper light-shielding film 543. Meanwhile, the physical distance between the upper light-shielding film 543 and the semiconductor layer is reduced by decreasing the levels of the layered structure thereby blocking the light entered at a substrate backside or upper surface to irregularly reflect within the substrate and possibly hit the semiconductor substrate.

Meanwhile, the holding capacitance in the pixel structure, in the disclosure of the invention, includes a capacitance 547 having the upper light-shielding film 543 and pixel electrode 546 as electrodes and the third interlayer insulating film 544 as a dielectric, and a capacitance 548 having the drain interconnection 540 and the upper light-shielding film 543 as electrodes and the third interlayer insulating film 544 as a dielectric. Thus, sufficient capacitance is secured without increasing the number of processes.

The present invention thus structured will be explained with greater detail by way of the embodiments shown in the following.

EMBODIMENTS

Embodiment 1

This embodiment explains a method for fabricating an active-matrix substrate, with using FIGS. 1A to 8. In the description, the substrate having a CMOS circuit, a drive circuit, and a pixel region having pixel TFTs and holding capacitances, formed on the same substrate is referred to as an active-matrix substrate for convenience.

First, this embodiment uses a substrate 501 formed of barium borosilicate glass or aluminum borosilicate glass, represented by Coning 7059 glass or 1737 glass. The substrate 501 may use a quartz substrate, a single-crystal silicon substrate or a metal or stainless-steel substrate, having an insulating film formed on a surface. Otherwise, may be used a plastic substrate having a heat resistance to a process temperature in this embodiment. This embodiment uses a quartz glass substrate.

Next, a lower light-shielding film is formed over the quartz substrate 501. First, formed is an underlying film of insulating film, such as a silicon oxide film, a silicon nitride film or a silicon oxide nitride film, having a film thickness of 10–150 nm (preferably 50–100 nm). Then, a lower light-shielding film is formed by a layered structure having a film thickness of approximately 300 nm of conductive materials, such as Ta, W, Cr and Mo, resistive to a process temperature in this embodiment. The lower light-shielding film serves also as a gate interconnection or extension interconnection in the pixel region or drive circuit. This embodiment formed a crystalline silicon film 502 having a film thickness of 75 nm and then deposited WSix (x=2.0–2.8) 503 having a film thickness of 150 nm. Thereafter, unwanted portions are etched away to form lower light-shielding films 502 and 503. Incidentally, this embodiment uses a multi-layer structure as the lower light-shielding film, but may use a single-layer structure of the lower light-shielding film. In the figure, the lower light-shielding film is shown only in the pixel region. However, also in the drive circuit, an interconnection is formed of the same material as the lower light-shielding film to provide a part of the gate interconnection or extension interconnection.

Then, on the substrate 501 and lower light-shielding film 503, formed is an underlying film 504 of insulating film, such as a silicon oxide film, a silicon nitride film or a silicon oxide nitride film, to a film thickness of 10–650 nm (preferably 50–600 nm). The underlying film 504 in this embodiment uses a single-layer structure but may use a structure having two or more layers of the insulating films. This embodiment forms, as an underlying film 504, a silicon oxide nitride film 504 (composition ratio: Si=32%, O=27%, N=24%, H=17%) having a film thickness of 580 nm deposited at 350° C. by a plasma CVD process using a reactive gas of $SiH_4$, $NH_3$ and $N_2O$.

Then, a semiconductor film 505 is formed on the underlying film 504. (FIG. 1A) The semiconductor film 505 is an amorphous-structure semiconductor film formed in a thickness of 25–80 nm (preferably 30–60 nm) by known means (sputter process, LPCVD process or plasma CVD process). The semiconductor film is not limited in material but preferably formed of silicon or silicon-germanium (SiGe) alloy.

Then, a thermal crystallizing process using a catalyst, such as nickel is conducted to crystallize the semiconductor film. (FIG. 1B) Besides the thermal crystallizing process using a catalyst of nickel or the like, a known crystallizing process (laser crystallizing process, thermal crystallizing process, etc.) may be combined.

This embodiment applies, by spin coat, a nickel acetate solution (concentration by weight 10 ppm, volume 5 ml) to the entire film surface to form a metal-containing layer 506 and expose it in a nitrogen atmosphere at a temperature of 600° C. for 12 hours.

In the case of also applying a laser crystallizing process, it is possible to use a pulse-oscillation type or continuous-emission type excimer laser, YAG laser, $YVO_4$ laser or the like. Where using such a laser, it is preferred to use a method that the laser light emitted from the laser oscillator is focused by an optical system into a linear form and irradiated to the semiconductor film. Although the condition of crystallization is properly selected by a practitioner, an excimer laser when used has a pulse oscillation frequency of 300 Hz and a laser energy density of 100–800 $mJ/cm^2$ (typically 200–700 $mJ/cm^2$). Meanwhile, where using a YAG laser, preferably used is a second harmonic at a pulse oscillation frequency of 1–300 Hz and a laser energy density of 300–1000 $mJ/cm^2$ (typically 350–800 $mJ/cm^2$). Thus, a laser light focused in a linear form having a width of 100–1000 μm, e.g. 400 μm, is irradiated over the entire substrate surface, wherein an overlap ratio of linear beam may be 50–98%.

Subsequently, gettering is conducted to remove or reduce the metal element used in accelerating the crystallization from a semiconductor layer for an active region. As for gettering, a method may be applied that is disclosed in Japanese Patent Laid-open No. 270363/1998. Otherwise, an extremely thin oxide layer for an etch stopper may be formed on the semiconductor film and then an amorphous silicon film containing phosphorus or an inert gas be formed as a gettering site on the oxide layer, and thereafter a thermal process be conducted for gettering to remove or reduce a metal element from the semiconductor layer for an active region, followed by removing the gettering site. This embodiment uses the art described in the foregoing publication to form, as a mask, a silicon oxide film having a film thickness of 50 nm and then carry out patterning on it thus obtaining a silicon oxide film 507a–507c in a desired form. An element of group-15 (typically P (phosphorus)) is selectively introduced to the semiconductor layer to form an impurity region 508a–508e. The method for introducing the impurity element may be by one or a plurality of processes selected from plasma doping process, ion-implant process and ion-shower doping process. Then, a second thermal process is carried out to move the metal element from the semiconductor layer for an active region to the impurity region 508a–508e. Thus, the metal element can be reduced from the semiconductor layer to an extent of less affecting the semiconductor characteristic. (FIG. 1C) The TFT having an active region thus made has a lowered off-current value and improved crystallinity, to provide high field-effect mobility because of well crystallinity and attain a favorable characteristic.

Then, the silicon oxide film 507a–507c is used as a mask to carry out etching on the crystalline semiconductor film, and then the silicon oxide film 507a–507c is removed to form a semiconductor layer 509–511. (FIG. 2A)

Herein, it is preferred that an insulating film is formed and a thermal process is made in order to improve crystallinity of the semiconductor film thereby causing thermal oxidation in the upper region of the semiconductor layer. For example, after depositing silicon oxide film to 200 nm in a low-pressure CVD apparatus, a thermal process is made in an anneal furnace. This process oxidizes an upper region of the semiconductor layer. By etching the silicon oxide film and oxidized region of the semiconductor layer, obtained is a semiconductor layer improved in crystallinity.

Meanwhile, after forming a semiconductor layer 509–511, a slight amount of impurity element (boron or phosphorus) may be introduced in order to control the TFT threshold.

Then, a resist mask 512a–512c is formed to introduce a second impurity element (second doping process), thus introducing an impurity element providing an n-type to the semiconductor layer. (FIG. 2B) The introduction of impurity element is under the condition of $1 \times 10^{13}$–$5 \times 10^{14}/cm^3$ at an acceleration voltage of 5–80 keV. This embodiment is carried out at a dose of $1.5 \times 10^{13}/cm^3$ and an acceleration voltage of 10 keV. The impurity element for providing an n-type uses an element belonging to 15 Group, typically, phosphorus (P) or arsenic (As) but herein uses phosphorus (P). At this time, because the mask 512a, 512c is already formed, a low-concentration impurity region 513, 514 is selectively formed. The low-concentration impurity region 513, 514 is added with the n-type-providing element in a concentration range of $1\times10^{18}$–$1\times10^{20}$/cm$^3$. Herein, the semiconductor layer at a region for forming a p-channel TFT is formed with the resist mask 512b to prevent the n-type-providing impurity element from being introduced.

Then, the resist mask is removed and a mask 515a–515c is newly formed to introduce a third impurity element (third doping process) as shown in FIG. 2C. The condition for introducing the impurity element is under a dose of $1\times10^{13}$–$1\times10^{15}$/cm$^2$ and an acceleration voltage of 5–80 keV. In this case, a mask 515b is formed not to introduce the n-type-providing impurity element to the semiconductor layer at a region for forming a p-channel TFT. Masks 515a, 515c are formed to selectively form a high-concentration impurity region in the semiconductor layer at a region for forming an n-channel TFT. This embodiment has a dose of $2\times10^{15}$/cm$^2$ and an acceleration voltage of 30 keV. In this manner, formed are a high-concentration impurity region 516, 518 and a low-concentration impurity region 517, 519. Incidentally, the second and third doping processes are not especially limited in order, i.e. a low-concentration impurity region may be formed after forming a high-concentration impurity region.

Then, the resist mask is removed and a mask 520a–520c is newly formed to introduce a fourth impurity element (fourth doping process) as shown in FIG. 3A. By introducing the fourth impurity element, added is an impurity element providing an opposite conductivity type to the one conductivity type to semiconductor layer to be formed into an active layer of a p-channel TFT. At this time, because there is the mask 520 formed, a low-concentration impurity region 521 is selectively formed. This embodiment forms a low-concentration impurity region 521 by an ion shower doping process using diborane (B$_2$H$_6$). The condition of ion shower doping process is under a dose of $1\times10^{13}$–$1\times10^{14}$/cm$^2$ and an acceleration voltage of 5–80 keV. In introducing the fourth impurity element, the semiconductor layer at a region for forming an n-channel TFT, covered by the resist mask 520a, 520c, is not introduced with the p-type-providing impurity element.

Then, the resist mask is removed and a mask 522a–522c is newly formed, to introduce a fifth impurity element (fifth doping process) as shown in FIG. 3B. The condition for introducing the impurity element is under a dose of $1\times10^{13}$–$1\times10^{15}$/cm$^2$ and an acceleration voltage of 5–80 keV. In this case, a mask 522a, 522c is formed not to introduce a p-type-providing impurity element to the semiconductor layer at a region for forming an n-channel TFT. Meanwhile, a mask 522b is formed to selectively form a high-concentration impurity region in the semiconductor layer at a region for forming a p-channel TFT. This embodiment uses a dose of $1\times10^{15}$/cm$^3$ and an acceleration voltage of 20 keV. In this manner, formed are a high-concentration impurity region 523 and a low-concentration impurity region 524. Incidentally, the fourth and fifth doping processes are not especially limited in order, i.e. a low-concentration impurity region may be formed after forming a high-concentration impurity region.

Meanwhile, this embodiment showed the example that p-type-providing impurity element was doped twice to the semiconductor layer at a region for forming a p-channel TFT to form a low-concentration impurity region and a high-concentration impurity region. However, there is no especial limitation, i.e. a high-concentration impurity region only may be provided. Meanwhile, the order of the second to fifth doping processes are not especially limited.

By the above process, a high-concentration impurity region and low-concentration impurity region is formed in each semiconductor layer.

Then, an insulating film 525 is formed covering the semiconductor layer 509–511. The insulating film 525 is formed by an insulating film containing silicon in a thickness of 20–150 nm by using a plasma CVD or sputter process. This embodiment formed a silicon oxide nitride film (composition ratio: Si=32%, O=59%, N=7%, H=2%) in a thickness of 35 nm by a plasma CVD process. Of course, the gate insulating film is not limited to a silicon oxide nitride film but may use another insulating film containing silicon.

In the case of using a silicon oxide film, it is possible to form it by a plasma CVD process that TEOS (Tetraethyl Ortho Silicate) and O$_2$ are mixed and a reaction pressure of 40 Pa and substrate temperature of 300–400° C. is provided to cause a discharge at a radio frequency (13.56 MHz) and an electric power density of 0.5–0.8 W/cm$^2$. The silicon oxide film thus formed can obtain a favorable characteristic as a gate insulating film by thereafter performing thermal anneal at 400–500° C.

Incidentally, a high-concentration impurity region and low-concentration impurity region may be formed by introducing the second to fifth impurity elements after forming an insulating film 525.

Then, after forming a contact 526–529 connected to the semiconductor layer and a contact 530 connected to the lower light-shielding film 503, a thermally resistive conductive film 531 is formed in a film thickness of 100–500 nm. This embodiment forms a W film having a film thickness of 400 nm by a sputter process using a W target. Alternatively, formation is possible by a thermal CVD process using tungsten hexafluoride (WF$_6$).

Incidentally, in this embodiment, the conductive film 531 uses W but is not limited. It may be formed of an element selected from Ta, W, Ti, Mo, Cu, Cr and Nd or an alloy material or compound material based on the element. Alternatively, a semiconductor film represented by a crystalline silicon film introduced with an impurity element, such a phosphorus, may be used. Otherwise, AgPdCu alloy may be used. This embodiment, although in a single-layer structure, may be formed by conductive films having two or more layers. Alternatively, a three-layered structure may be provided by sandwiching a conductive film having a low thermal resistance, such as Al, by conductive films having high thermal resistance.

Then, a resist mask (not shown) is formed by using a photolithography process, to carry out an etching process for forming an electrode and interconnection. This embodiment uses, as an etching condition, an ICP (Inductively Coupled Plasma) etching process. Using CF$_4$, Cl$_2$ and O$_2$ for an etching gas to provide a gas flow-rate ratio of 25:25:10 (sccm), a plasma was caused by turning on a 500-W RF (13.56 MHz) electric power to a coil-type electrode at a pressure of 1 Pa thereby carrying out etching. A 150-W RF (13.56 MHz) electric power is turned on to a substrate side (sample stage), to apply substantially negative self-bias voltage. In this manner, an interconnection 534 is formed that connects between the gate electrode 533. 535, 538, the source interconnection 532, 537, the drain interconnection 536. 540, the n-channel TFT and the p-channel TFT.

Figure 6:
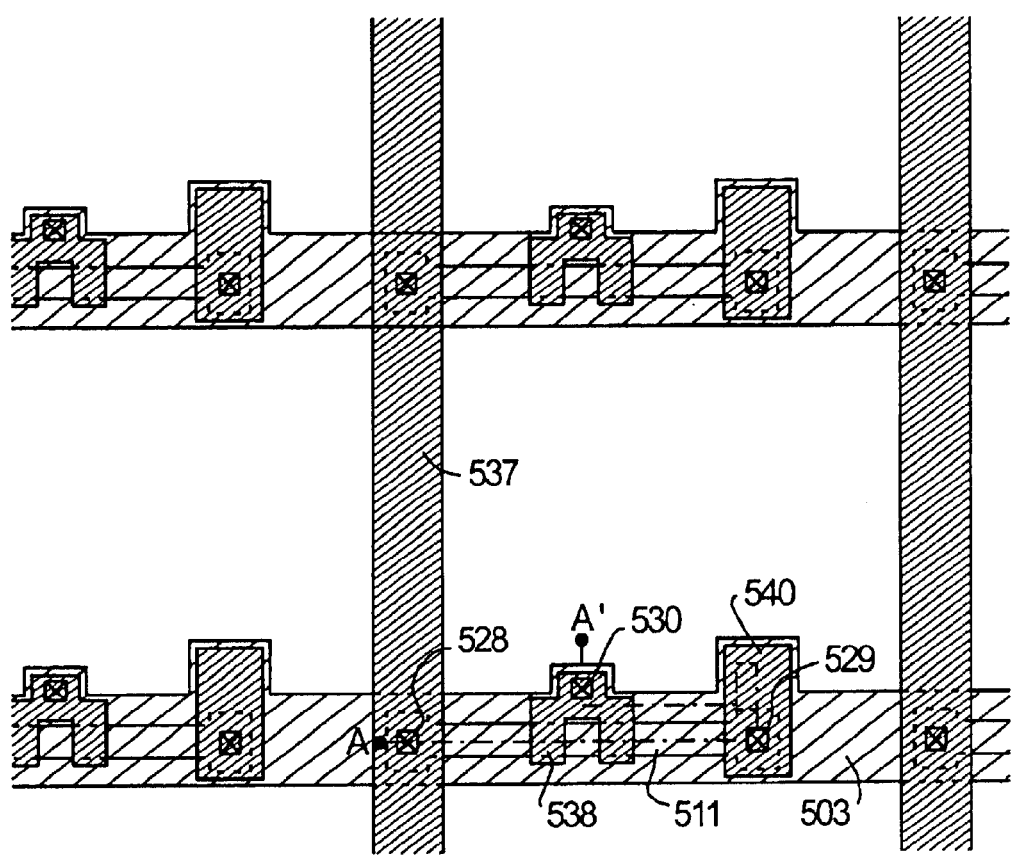
FIG. 6 is a top view showing a structure of a pixel TFT.

FIG. 6 shows a top view in a state fabricated so far. Note that the elements corresponding to those of FIGS. 1A–4A are designated with the same reference numerals. The chain line A–A' in FIG. 4A corresponds to the sectional view taken on the chain line A–A' in FIG. 6.

Then, a first interlayer insulating film 541 is formed covering the electrode and interconnection 532–540. The first interlayer insulating film 541 is formed by an insulating film containing silicon having a thickness of 100–200 nm, by the use of a plasma CVD or sputter process. This embodiment forms a silicon oxide nitride film having a film thickness of 150 nm by a plasma CVD process. Of course, the first interlayer insulating film 538 is not limited to a silicon oxide nitride film but may use another single-layer or multi-layered structure containing silicon.

Then, a thermal process is carried out to restore crystallinity in the semiconductor layer and activate an impurity element added to each semiconductor layer. The thermal process is made by a thermal anneal process using an anneal furnace. The thermal anneal process may be carried out in a nitrogen atmosphere having an oxygen concentration of 1 ppm or less, preferably 0.1 ppm or less, at 400–700° C., typically 500–550° C. This embodiment carried out an activation process by the thermal process at 550° C. for 4 hours. Incidentally, besides the thermal anneal process, it is possible to apply a laser anneal process using a YAG laser or a rapid thermal anneal process (RTA process).

Meanwhile, a thermal process may be made prior to forming a first interlayer insulating film. However, where an interconnect material used is less resistive to heat, it is preferred to perform a thermal process after forming a first interlayer insulating film for protecting interconnections as in the present embodiment.

Furthermore, a thermal process (at 300–550° C. for 1–12 hours) is made to carry out a hydrogenation process. This process is a process to terminate a dangling bond in the semiconductor layer by the hydrogen contained in the first interlayer insulating film 541. Of course, the semiconductor layer can be hydrogenated regardless of the presence of a first interlayer insulating film. The hydrogenation may be made by plasma hydrogenation (using the hydrogen excited by a plasma) or a thermal process in an atmosphere containing hydrogen by 3–100% at 300–450° C. for 1–12 hours.

Then, a second interlayer insulating film 542 is formed of an inorganic insulation material or organic insulation material on the first interlayer insulating film 541. There are cases of increase in capacitance where the distance between one electrode and the other electrode of a holding capacitance is even rather than different from point to point. Namely, it is preferred to form, in parallel, a drain interconnection and an upper light-shielding film to be formed in the later process. For this reason, the second interlayer insulating film 542 is preferably planarized at its surface. A known art for improving surface planarity, e.g. a polish process called CMP (Chemical Mechanical Polish) may be employed. Furthermore, capacitance can be increased at a closer distance between one electrode and the other electrode of the holding capacitance. For this reason, it is preferred that, after forming a planar insulating film, etch-back, polish process or the like is carried out to provide the surface of the second insulating film and the drain interconnection as near as possible. In this case, it is preferred to expose the first interlayer insulating film 541 formed on the drain interconnection. Also, capacitance increases also in proportion to the dielectric constant of a dielectric. Consequently, by forming a first interlayer insulating film to a film having a higher dielectric constant than a second interlayer insulating film, it is possible to further increase the holding capacitance formed by the drain interconnection, the interlayer insulating film and the upper light-shielding film. In this embodiment, an acrylic-resin film having a film thickness of 1 μm is formed as a second interlayer insulating film 542 and etched to expose a part of the first interlayer insulating film 541 formed on the gate electrode, source interconnection and drain interconnection whereby surface planarization is made by the first and second interlayer insulating films. (FIG. 4B)

Incidentally, this embodiment, although forming the first and second interlayer insulating films, may of course made in a single-layer structure. In also this case, it is preferred to use a film planarized at its surface.

Then, on the second interlayer insulating film 541, a film having a high property of the light-shielding, such as Al, Ti, W, Cr or black resin, is patterned to a desired form, to form an upper light-shielding film 543. The light-shielding film 543 is arranged in a mesh form to provide light-shielding in regions other than pixel openings.

Figure 7:
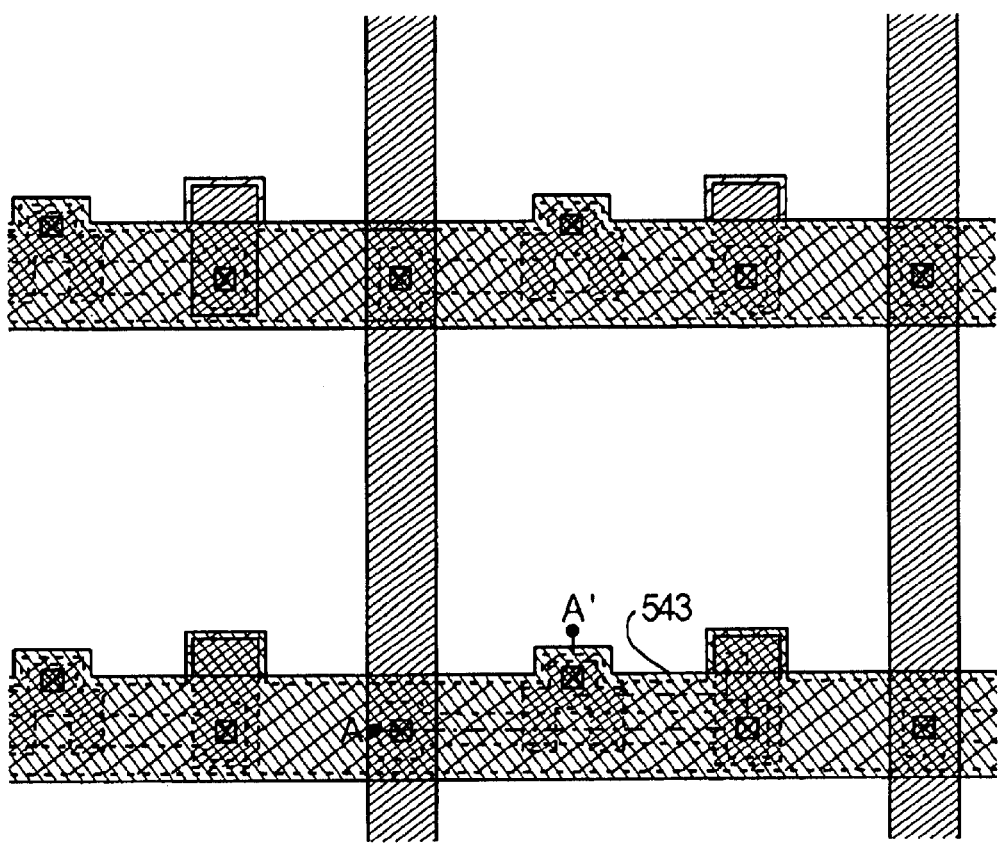
FIG. 7 is a top view showing a structure of a pixel TFT.

FIG. 7 shows a top view in a state fabricated so far. Note that the elements corresponding to those of FIGS. 1A to 4B are designated with the same reference numerals. The chain line A–A' in FIG. 4B corresponds to the sectional view taken on the chain line A–A' in FIG. 7.

Furthermore, a third interlayer insulating film 544 is formed of an inorganic insulation material or organic insulation material in a manner covering the upper light-shielding film 543. The third interlayer insulating film 544 preferably uses a film planarized at its surface, in order to provide a sufficient holding capacitance by the upper light-shielding film, the third interlayer insulating film and the pixel electrode to be formed in the later process. Meanwhile, surface planarization may be made by carrying out etch-back or polish process after forming an insulating film, thereby forming a third interlayer insulating film 544. Furthermore, in order to increase capacitance, it is preferred to use a film having a high dielectric coefficient or form a film as thin as possible.

Then, a pixel electrode 546 is formed by forming a contact hole 545 leading to the drain interconnection 540 and a transparent conductive film of ITO or the like in a thickness of 100 nm and patterning it into a predetermined form.

Incidentally, the holding capacitance includes a capacitance 547 having electrodes of the upper light-shielding film 543 and the pixel electrode 546 and a dielectric of the third interlayer insulating film 544, and a capacitance 548 having electrodes of the drain interconnection 540 and the pixel electrode 546 and a dielectric of the third interlayer insulating film 544. Thus, sufficient capacitance can be secured without increasing the number of process steps.

Figure 8:
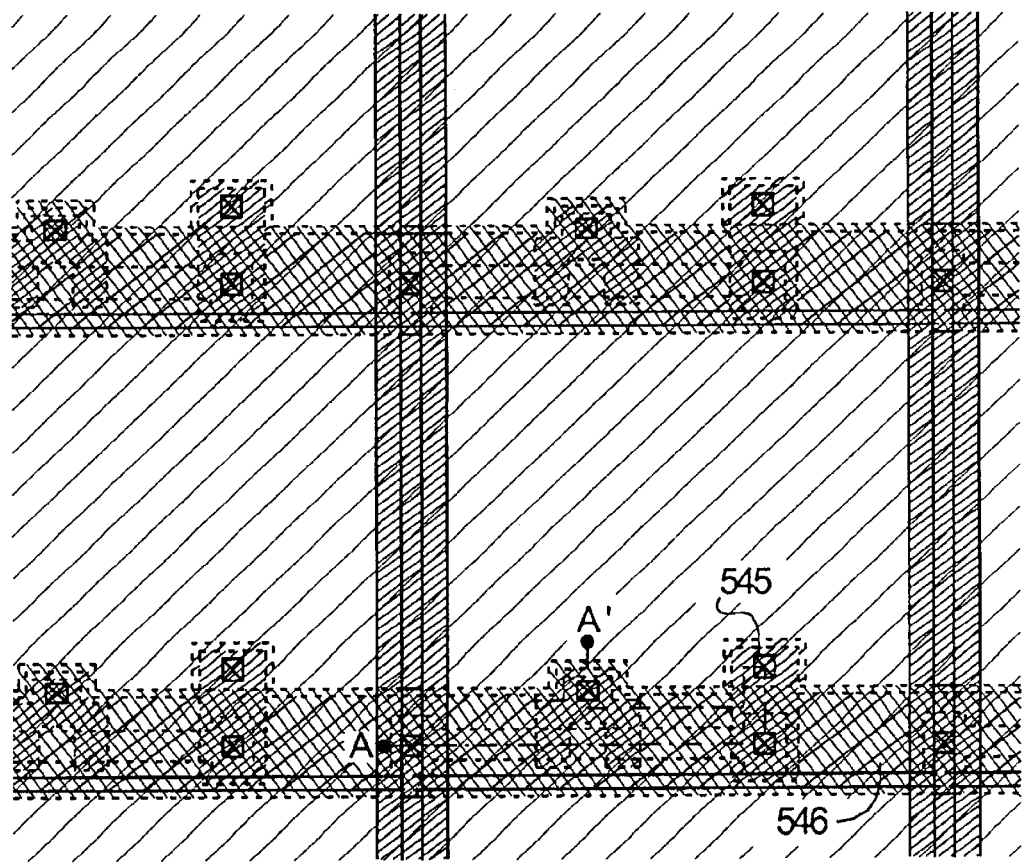
FIG. 8 is a top view showing a structure of a pixel TFT.

FIG. 8 shows a top view in a state so far fabricated. Incidentally, the elements corresponding to those of FIGS. 1A to 4B are denoted at the same reference numerals. The chain line A–A' in FIG. 5 corresponds to the sectional view taken on the chain line A–A' in FIG. 8.

Figure 9A:
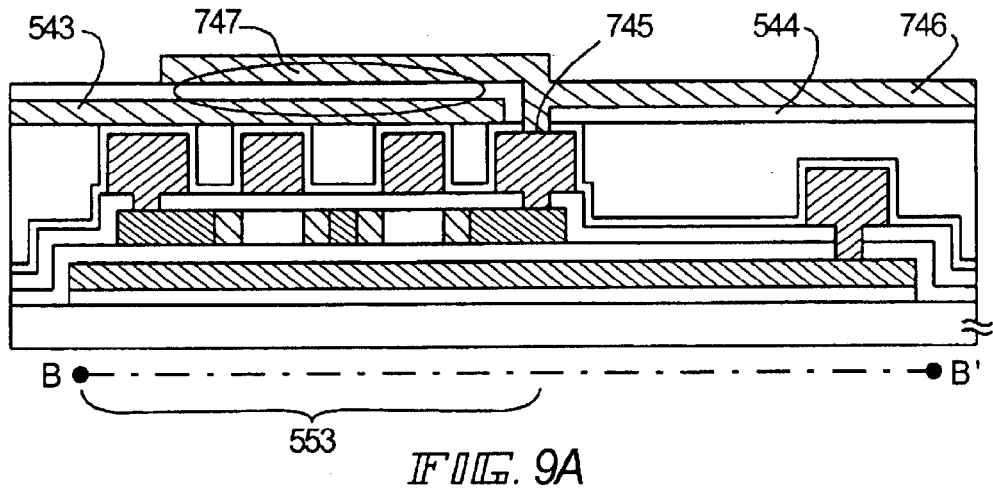
FIGS. 9A and 9B are a sectional view and a top view showing a manufacturing process of a pixel TFT.
Figure 9B:
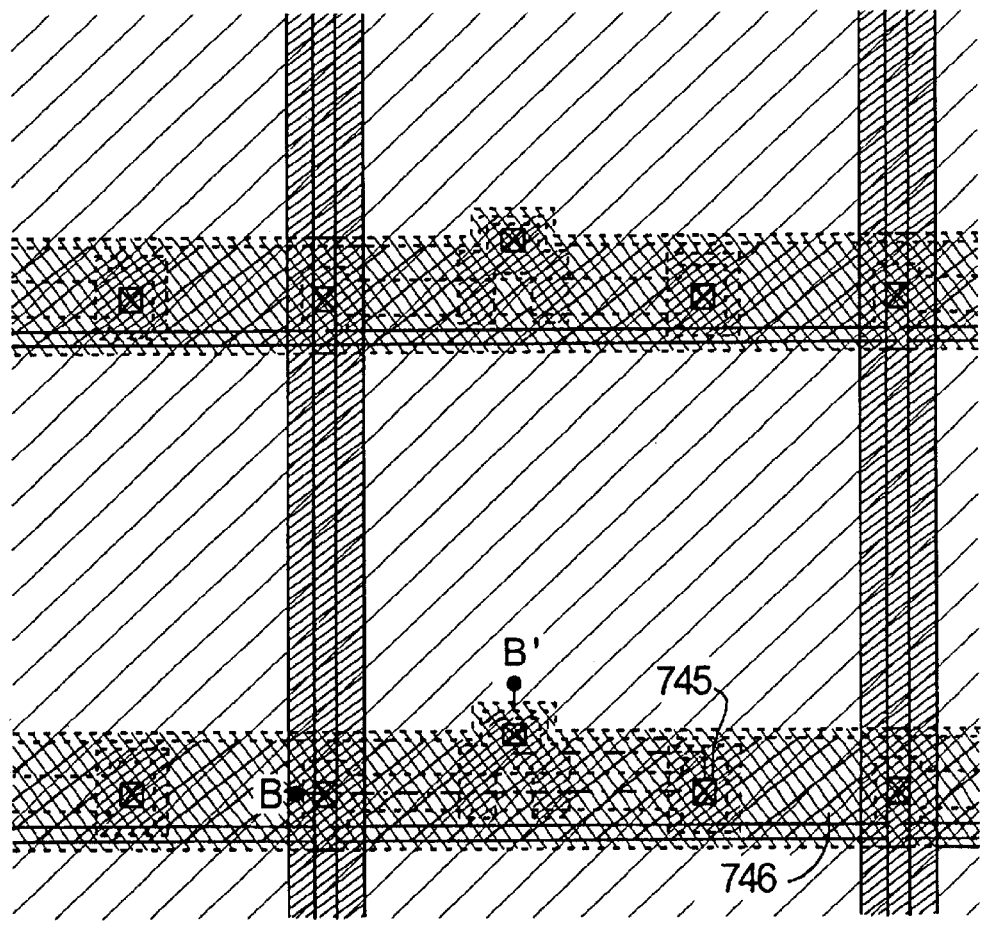

As shown in FIGS. 9A and 9B, the opening ratio can be further improved by making a contact hole 745 leading to the drain interconnection in a position over a contact hole connecting between the drain region and the drain interconnection. The chain line B–B' in FIG. 9A corresponds to the sectional view taken on the line B–B' in FIG. 9B. In this case, the holding capacitance is given by a capacitance 747 having electrodes of the upper light-shielding film 543 and the pixel electrode 746 and a dielectric of the third interlayer insulating film 744.

In this manner, completed is an active-matrix substrate forming, on the same substrate, a drive circuit 555 having an n-channel TFT 551 and p-channel TFT 552 and a pixel region 556 having a pixel TFT 553 and holding capacitances 546, 547.

In the active-matrix substrate thus formed, because the gate electrode, the source interconnection and the drain interconnection are formed in the same process, the number of processes can be reduced than that of the conventional. This improves yield and realizes cost reduction. Meanwhile, because the physical distance is decreased between the upper light-shielding film and the semiconductor film, it is possible to prevent current leakage from occurring due to light leak or optical diffraction. Furthermore, the direct connection of the source interconnection to the semiconductor film makes the number of contact holes minimum. This can improve the opening ratio in manufacturing a liquid crystal display device.

Embodiment 2

This embodiment explains a method to fabricate a holding capacitance in a pixel region in a manner different from that of Embodiment 1. Note that the process is the same as the formation of up to the second interlayer insulating film shown in FIG. 4B on Embodiment 1, and hence omittedly explained.

An upper light-shielding film is formed on the second interlayer insulating film. This embodiment uses, in an upper light-shielding film, layers of a film 643$a$ based on titanium and a film 643$b$ based on aluminum. By carrying out anodic oxidation or plasma oxidation on a surface of the upper light-shielding film, anodization is made in a part of the aluminum-based film 643$b$ and titanium-based film 643$a$ to form an aluminum oxide film (alumina film) as an oxide insulating film 644$b$. The oxide insulating film 644$b$ is used as a dielectric of a holding capacitance. Incidentally, the oxide insulating film obtained by anodizing tantalum (Ta) or titanium (Ti) has a high dielectric constant and hence can be suitably used as a dielectric of a holding capacitance. Meanwhile, the oxide insulating film desirably has a thickness of 20–100 nm (preferably 30–50 nm). (FIG. 10A)

In the anodization process, first prepared an ethylene glycol tartrate solution having a sufficiently low alkali-ion concentration. This is a solution of a mixture of an 15% ammonium tartrate solution and ethylene glycol in 2:8. Ammonia water is added to the solution to adjust pH to 7±0.5. A platinum electrode, as a cathode, is provide in the solution. A substrate formed with a light-shielding film 122 is immersed in the solution and an anode is arranged with the light-shielding film 122, thereby flowing a constant direct current (several to several tens mA). This embodiment flows a current of 200 mA through one substrate.

The voltage between the cathode and the anode in the solution varies with time in accordance with anodic oxide growth. The voltage is increased at a constant boosting rate while keeping a constant current. When a voltage 45 V is reached, the anodization process is ended. In this manner, an oxide insulating film 645 can be formed in a thickness of approximately 50 nm over a surface of the upper light-shielding film. Note that the numeric values concerning the anodization process shown herein are mere examples, and optimal values are naturally to vary depending upon a device size in the manufacture.

Although this embodiment was structured to provide an insulating film only on the light-shielding film, surface by the use of an anodization process, the insulating film may use a film formed by a vapor-phase process such as plasma CVD process, thermal CVD process or sputter process, or a layered film combined with one or a plurality of a DLC (Diamond Like Carbon) film, a tantalum oxide film and an organic insulating film.

Then, a third interlayer insulating film 646 is formed. The third interlayer insulating film 646 is formed using an inorganic insulating material or organic insulating film. This embodiment forms polyimide to a film thickness of 1.5 μm. Subsequently, the interlayer insulating film at a region for a holding capacitance is etched away to expose the oxide insulating film 644$b$.

Subsequently, by making a pixel electrode 648 according to Embodiment 1, an active-matrix substrate is completed as shown in FIG. 10C.

Incidentally, the holding capacitance includes a capacitance 649 having electrodes of the upper light-shielding film 643 and the pixel electrode 546 and a dielectric of the oxide insulating film 645, and a capacitance 650 having electrodes of the drain interconnection 540 and the upper light-shielding film 643 and a dielectric of the third interlayer insulating film 647. Thus, sufficient capacitance can be secured without increasing the number of process steps.

In the active-matrix substrate thus formed, because the gate electrode, the source interconnection and the drain interconnection are formed in the same process, the number of processes can be reduced than that of the conventional. This improves yield and realizes cost reduction. Meanwhile, because the physical distance is decreased between the upper light-shielding film and the semiconductor film, it is possible to prevent current leakage from occurring due to light leak or optical diffraction. Furthermore, the direct connection of the source interconnection to the semiconductor film makes the number of contact holes minimum. This can improve the opening ratio in manufacturing a liquid crystal display device.

Embodiment 3

This embodiment explains a method for manufacturing an active-matrix substrate having TFTs of a GOLD structure formed by the use of the invention. Note that the process is the same as that of Embodiment 1 up to the formation of the conductive film shown in FIG. 3C and hence omittedly explained.

Herein, a photolithography process is used to form a resist mask (not shown) and carry out etching for forming electrodes and interconnections. At this time, the etching process is made such that the low-concentration impurity region in part is overlapped with the gate electrode. In this manner, an interconnection 634 is formed connecting the gate electrode 633, 635, 638, the source interconnection 632. 637, the drain interconnection 636, 640, the n-channel TFT and the p-channel TFT. (FIG. 11A)

Then, by forming up to a pixel electrode 546 according to Embodiment 1, an active-matrix substrate is completed. (FIG. 11B)

In the active-matrix substrate thus formed, because the gate electrode, the source interconnection and the drain interconnection are formed in the same process, the number of processes can be reduced than that of the conventional. This improves yield and realizes cost reduction. Meanwhile, because the physical distance is decreased between the upper light-shielding film and the semiconductor film, it is possible to prevent current leakage from occurring due to light leak or optical diffraction. Furthermore, the direct connection of the source interconnection to the semiconductor film makes the number of contact holes minimum. This can improve the opening ratio in manufacturing a liquid crystal display device. Meanwhile, the GOLD-structured TFT can reduce off-current thereby improving TFT reliability.

Although this embodiment showed the example that both the pixel region TFT and the drive circuit TFT are made in a GOLD structure, the invention is not especially limited. Namely, the drive circuit TFT (n-channel TFT or p-channel TFT) only may be made in a GOLD structure or the n-channel TFT in a part of the drive circuit only may be made in a GOLD structure.

Embodiment 4

Figure 12:
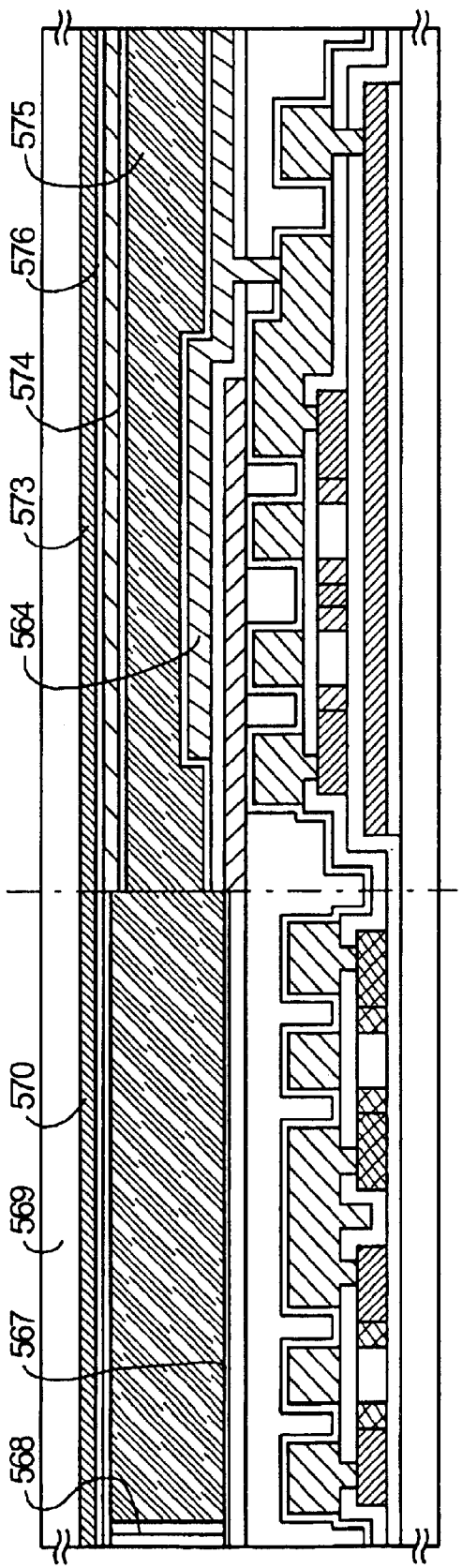
FIG. 12 is a sectional view showing a manufacturing process for an active-matrix liquid crystal display device.

This embodiment explains a process for manufacturing a light-transmission liquid crystal display device from an active-matrix substrate made in Embodiment 1. FIG. 12 is used in explanation.

Figure 5:
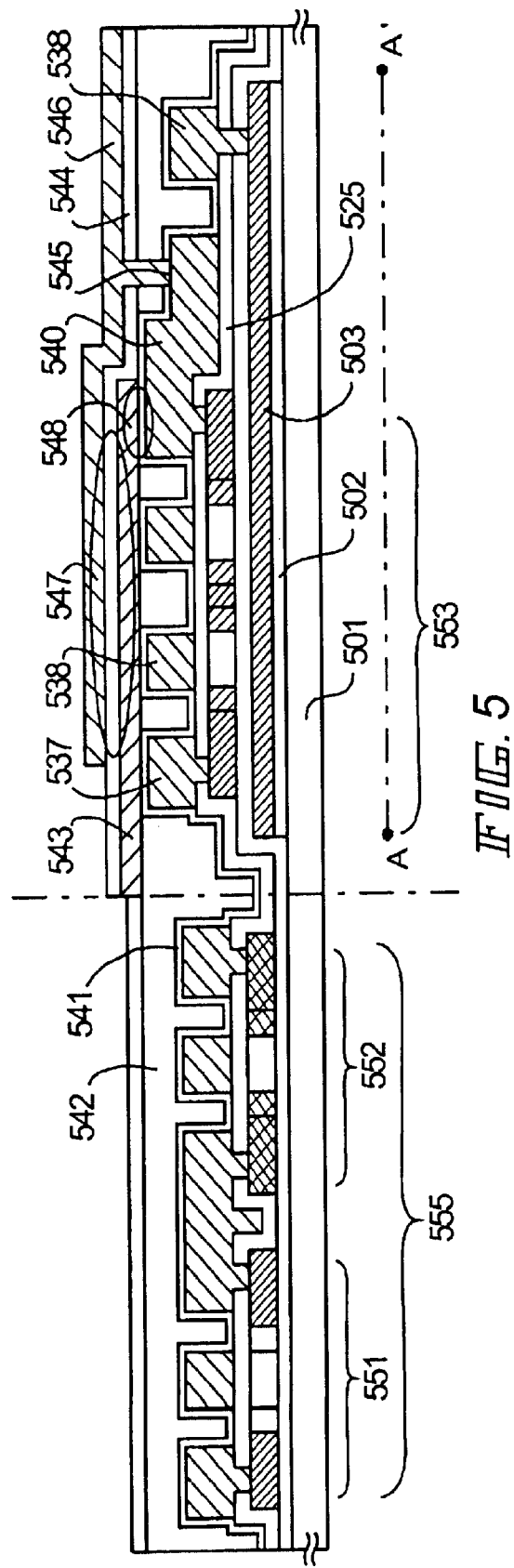
FIG. 5 is a sectional view showing the manufacturing process of a pixel TFT and drive-circuit TFT.

At first, an active-matrix substrate in a state of FIG. 5 is obtained according to Embodiment 1. Then, an orientation film 567 is formed on the active-matrix substrate, at least on the pixel electrode 547, and subjected to a rubbing process. This embodiment, prior to forming an orientation film 567, carries out patterning on an organic resin film of an acrylic resin film or the like thereby forming pillar-like spacers (not shown) in predetermined positions to hold a substrate spacing. Spherical spacers, in place of the pillar-like spacers, may be distributed over the entire substrate surface.

Then, a counter substrate 569 is prepared. Next, a coloring layer 570 and a planarizing film 573 are formed on the counter substrate 569.

Then, a counter electrode 576 of transparent conductive film is formed on the planarized film 573 at least in a pixel region. An orientation film 574 is formed over the entire surface of the counter substrate and then subjected to a rubbing process.

The active-matrix substrate forming a pixel region and drive circuit and the counter substrate are bonded together through a seal member 568. The seal member 568 is mixed with a filler. By the filler and the spacers, the two substrates are bonded together with an even spacing. Thereafter, a liquid crystal material 575 is filled between the substrates and completely sealed by a sealant (not shown). The liquid crystal material 575 may use a known liquid crystal material. In this manner, a reflective-type liquid crystal display shown in FIG. 12 is completed. If required, the active-matrix substrate or counter substrate is divided into a desired shape. Furthermore, a polarizing plate (not shown) was bonded only on the counter substrate. Then, an FPC was bonded by a known technique.

In the liquid crystal display device thus fabricated, because the physical distance is decreased between the upper light-shielding film and the semiconductor film, it is possible to prevent current leakage from occurring due to light leak or optical diffraction. Furthermore, the direct connection of the source interconnection to the semiconductor film makes the number of contact holes minimum. This can improve the opening ratio in manufacturing a liquid crystal display device. Meanwhile, sufficient holding capacitance can be secured by forming a holding capacitance by the drain interconnection, the interlayer insulating film, the light-shielding film, the first insulating film and the pixel electrode. In this manner, reliability is improved for the liquid crystal display device to realize display with definition. Such a liquid crystal display device can be used as a display part of an electronic appliance in various kinds.

Note that this embodiment can be freely combined with any one of Embodiments 1–3.

Embodiment 5

The CMOS circuit and pixel region formed by applying the invention can be used in an electro-optical device (active-matrix liquid crystal display device, active-matrix EC display device) in various kinds. Namely, the invention is applicable to every electronic appliance built with such an electro-optical device in a display part.

Such electronic appliances include a projector. It is shown as an example in FIGS. 13A–13D.

Figure 13A:
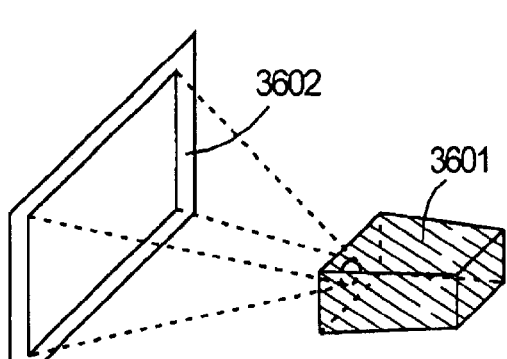
FIGS. 13A–13D are views showing an example of a semiconductor device.

FIG. 13A is a front-type projector, including a projection unit 3601 and a screen 3602. The invention is applicable to a liquid crystal display device 3808 constituting a part of the projection unit 3601 or the other drive circuits.

Figure 13B:
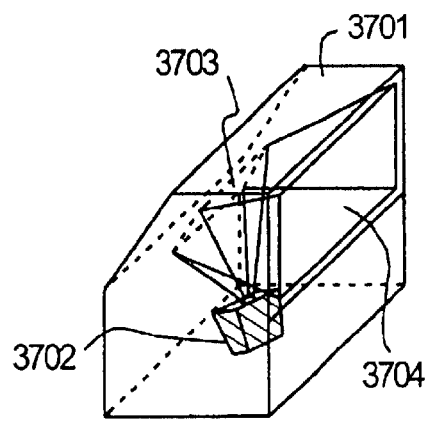

FIG. 13B is a rear-type projector, including a main body 3701, a projection unit 3702, a mirror 3703 and screen 3704. The invention is applicable to a liquid crystal display device 3808 constituting a part of the projection unit 2702 or the other drive circuits.

Figure 13C:
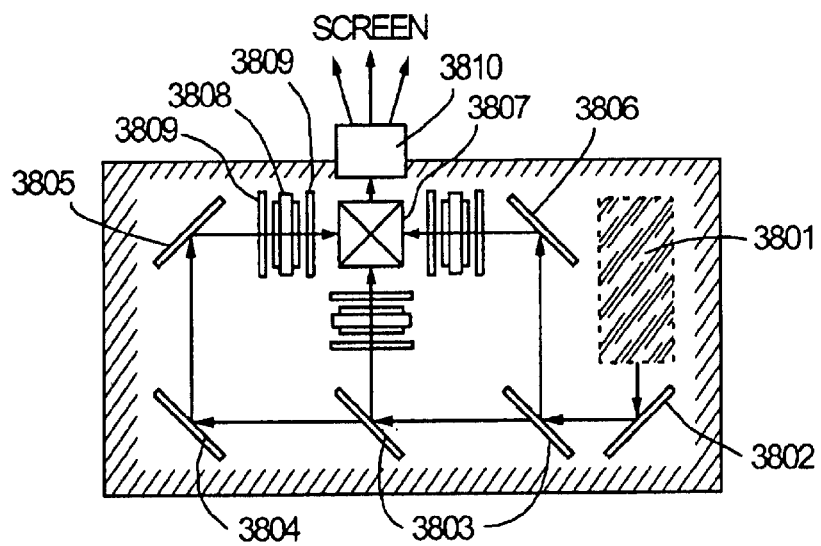

Incidentally, FIG. 13C is a view showing a structure of the projection unit 3601, 3702 in FIG. 13A and FIG. 13B. The projection unit 3601, 3702 is structured with a light-source optical system 3801, mirrors 3802, 3804–3806, a dichroic mirror 3803, a prism 3807, a liquid crystal display device 3808, a phase difference plate 3809 and a projection optical system 3810. The projection optical system 2810 is structured with an optical system including a projection lens. Although this embodiment showed an example of three-plate type, the invention is not especially limited, e.g. may be a single-plate type. Meanwhile, the practitioner may properly provide an optical system, such as an optical lens, a film having a polarization property, a film for adjusting a phase difference, IR film or the like, in an optical path shown at the arrow in FIG. 13C.

Figure 13D:
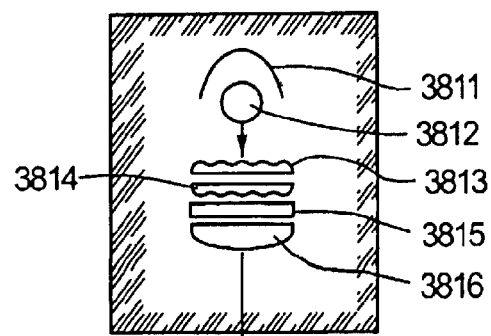

FIG. 13D is a view showing an example of a structure of the light-source optical system 3801 in FIG. 13C. In this embodiment, the light-source optical system 3801 is structured with a reflector 3811, a light source 3812, a lens array 3813, 3814, a polarization converter 3815 and a focus lens 3816. Incidentally, the light-source optical system shown in FIG. 13D is one example and the invention is not limited thereto. For example, the practitioner may provide an optical system, such as an optical lens, a film having a polarization property, a film for adjusting a phase difference, IR film or the like, in the optical system.

Embodiment 6

This embodiment shows, in FIGS. 14A–14C, an example of gettering by the use of an amorphous semiconductor film containing an inert gas.

At first, a semiconductor film is crystallized in the same process as in FIG. 1B, according to Embodiment 1. (FIG. 14A) Incidentally, FIG. 14A is the same as FIG. 1B and hence omittedly explained herein.

Then, a surface is treated with ozone water for 120 seconds to form an oxide-film barrier layer having totally 1–5 nm. This embodiment used ozone water to form a barrier layer 1401. However, a barrier layer may be formed by a method of oxidizing the surface of the crystal-structured semiconductor film due to radiating an ultraviolet ray in an oxygen atmosphere, by a method of oxidizing the surface of the crystal-structured semiconductor film due to an oxygen plasma process, or by depositing an oxide film having approximately 1–10 nm due to a plasma CVD process, sputter process or evaporation process.

In the description, the barrier layer refers to a layer having a film quality or thickness allowing a metal element to pass in a gettering process and serving as an etching stopper in a removal process of a gettering site layer.

Then, an amorphous silicon film 1402 containing an argon element for a gettering site is formed to a thickness of 50 nm–400 nm, herein a film thickness of 150 nm on the barrier layer 1401, by a plasma CVD or sputter process. (FIG. 14B) This embodiment used a silicon target in a sputter process to deposit a film at a pressure of 0.3 Pa in an argon atmosphere. Although this embodiment used an inexpensive gas, argon. However, there is no especial limitation, i.e. an amorphous silicon film containing an inert gas element may be formed as a gettering site.

Thereafter, a thermal process is made in a furnace heated up at 650° C. for 3 minutes to carry out gettering, thereby reducing the nickel content in the crystal-structured semiconductor layer 505. A lamp anneal apparatus may be used in place of the furnace.

Then, the barrier layer 1401 is used as an etching stopper to selectively remove the amorphous silicon film 1402 containing an argon element for a gettering site. Thereafter, the barrier layer is selectively removed by diluted hydrogen fluoride. Incidentally, because nickel during gettering tends to move toward a region having high oxygen concentration, the barrier layer of an oxide film is desirably removed after gettering.

Next, a thin oxide film is formed in a surface of an obtained crystal-structured silicon film (called a polysilicon film) by using a ozone water. Then, a resist mask is formed and etch-processed into a desired form, thereby forming an island-separated semiconductor layers 509, 510, 511. After forming the semiconductor layer, the resist mask is removed.

The state so far is nearly the same as that of FIG. 2A. The subsequent process may be according to Embodiment 1.

In the gettering method shown in this embodiment, because the distance between the crystal-structured silicon film and the region for a gettering site is as short as approximately 1–10 nm, the metal element in the semiconductor film can be removed or reduced with higher efficiency than the gettering method shown in Embodiment 1.

Meanwhile, the present embodiment can be freely combined with any one of Embodiments 1 to 5.

Embodiment 7

Figure 15A:
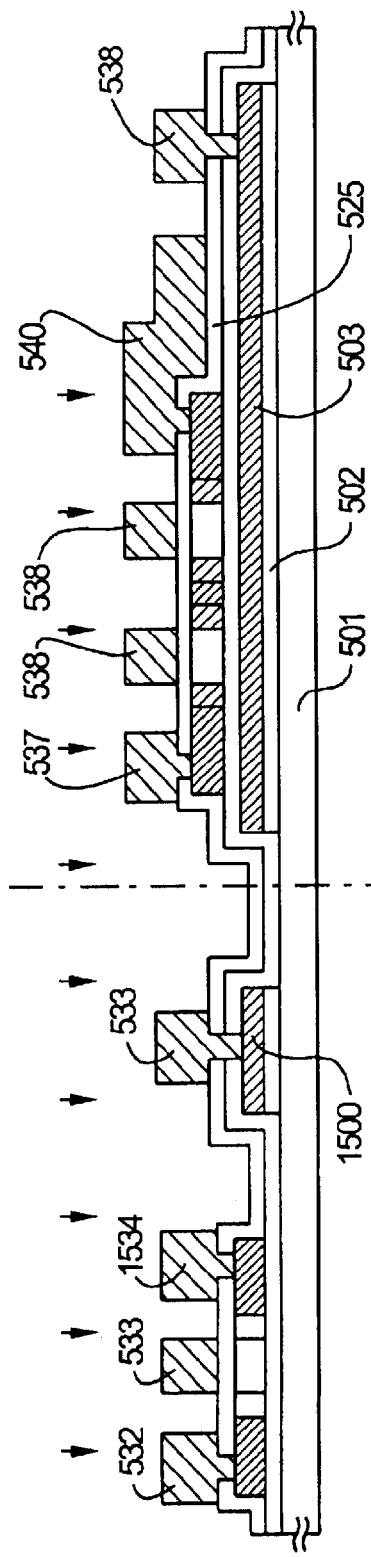
FIGS. 15A and 15B are views showing Embodiment 7.

This embodiment shows, in FIG. 15, an example to form a drive circuit only with n-channel TFTs. This shows an example to form a low-concentration impurity region in a self-aligned fashion in a sequence of doping changed from that of Embodiment 1. Note that, in FIG. 15, the elements same as those of Embodiment 1 are denoted at the same reference numerals.

First, a state same as that of FIG. 2A is obtained according to Embodiment 1. In order to obtain the same state as that of FIG. 2A, used are a first mask for forming a lower light-shielding film and a second mask for forming an oxide film.

Next, without performing a second doping process in Embodiment 1, a second doping process of this embodiment is made by using the same mask as that of the third doping process of Embodiment 1 to form a high-concentration impurity region. Herein, the second doping process uses a third mask.

Then, an insulating film is formed covering the semiconductor layer. This insulating layer is formed by an insulating film containing silicon having a thickness of 20–150 nm by the use of a plasma CVD or sputter process.

Then, a fourth mask is used to selectively etch the insulating film thereby forming an opening (contact hole) reaching the semiconductor layer or lower light-shielding film. Thereafter, a heat-resistive conductive film is formed with a film thickness of 100–500 nm. This embodiment forms a W film having a film thickness of 400 nm by a sputter process using a W target. Besides, it is possible to form it by a thermal CVD process using tungsten hexafluoride ($WF_6$).

Then, a fifth mask is used to carry out an etching process for forming electrodes and interconnections. In this manner, formed are a gate electrode 533 connected to an electrode 1500, a gate electrode 538 connected to the lower light-shielding film 503, a source interconnections 532, 537 and drain interconnections 1534, 540. Meanwhile, in this embodiment, the drive circuit is structured only with n-channel TFTs, showing the interconnection 1500 connected to the gate electrode of the drive circuit. In the drive circuit, this interconnection 1500 is used not to have mutual crossing-over between the gate interconnection, the source interconnection and the drain interconnection.

Next, a third doping process is made. The third doping process forms a low-concentration impurity region in a self-aligned fashion without using a mask. (FIG. 15A) The doping condition, herein, may be provided the same as the second doping condition of Embodiment 1. The formation of a low-concentration impurity region in a self-aligned fashion is not dependent upon accuracy in mask alignment, thus coping with further micro-fabrication.

Then, similarly to Embodiment 1, a first interlayer insulating film 541 is formed covering the electrode and interconnection.

Figure 15B:
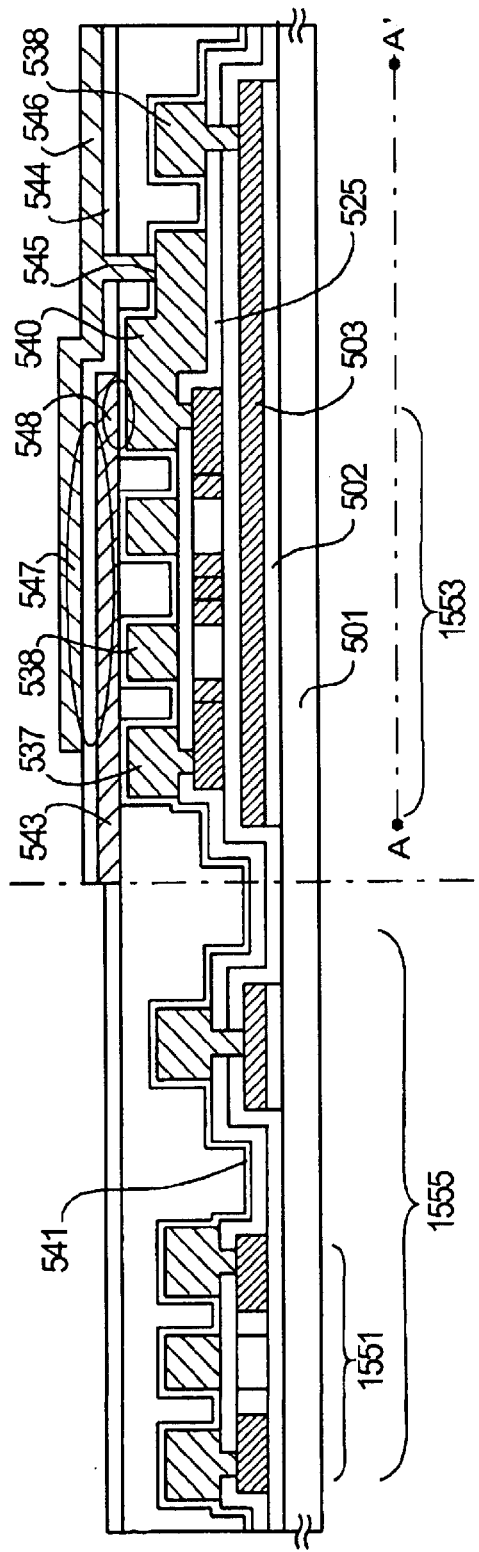

The subsequent process may form an active-matrix substrate formed with a drive circuit 1555 having n-channel TFTs 1551 and pixel TFTs 1553 shown in FIG. 15B, according to Embodiment 1. In order to obtain the same state as that of FIG. 15B, used are a sixth mask for forming an upper light-shielding film made by a film having high light-shielding-ability such as black resin, a seventh mask for forming a contact hole reaching the drain interconnection and an eighth mask for forming a pixel electrode 546 by a transparent conductive film.

This embodiment forms only n-channel TFTs and low-concentration impurity regions in a self-aligned fashion, thereby decreasing the masks to totally eight.

Meanwhile, this embodiment can be freely combined with any one of Embodiments 1 to 6.

The adoption of the structure of the present invention provides the following basic significances.

(a) The number of processes can be reduced than that of the conventional.

(b) By reducing the number of processes, the number of levels is decreased than that of the conventional to decrease the physical distance between the upper light-shielding film and the semiconductor film, thus improving the property of the light-shielding film onto the semiconductor film.

(c) Because of the direct connection between the source interconnection and the source region, the number of contact holes can be reduced to improve the opening ratio.

(d) A sufficient capacitance can be secured by forming a holding capacitance by an upper light-shielding film, an insulating film formed on the upper light-shielding film and a pixel electrode formed on the insulating film. Furthermore, a holding capacitance can be formed by a drain interconnection, an insulating film formed on the drain interconnection and an upper light-shielding film. Furthermore, the capacitance can be provided further sufficiently by forming an insulating film in a reduced thickness or by forming with a film having a high dielectric constant.

(e) By forming a gate electrode, a source interconnection and a drain interconnection of the same material and with the same mask, there is required a smaller alignment margin for the electrode and interconnection. This is suited for microfabrication thereof.

While satisfying the merits of (a)–(e), the semiconductor device represented by an active-matrix liquid crystal display device can be improved in semiconductor-device operation characteristic and reliability, thus realizing improvement in yield. Furthermore, it is possible to realize the reduction in manufacture cost of the semiconductor device.

What is claimed is:

1. A semiconductor device comprising:
   a gate electrode formed over a semiconductor film through a first insulating film and source and drain interconnections connected to the semiconductor film being formed of a same conductive material;
   a second insulting film formed over the source and drain interconnections;
   a light-shielding film formed over the second insulating film;
   a third insulating film formed over the light-shielding film; and
   a pixel electrode formed over the third insulating film, the pixel electrode electrically connected to the drain interconnection,
   wherein a holding capacitance is formed by the light-shielding film, the third insulating film and the pixel electrode.

2. A semiconductor device comprising:
   a gate electrode formed over a semiconductor film through a first insulating film and source and drain interconnections connected to the semiconductor film being formed of a same conductive material;
   a second insulting film formed over the source and drain interconnections;
   a light-shielding film formed over the second insulating film;
   a third insulating film formed over the light-shielding film; and
   a pixel electrode formed over the third insulating film, the pixel electrode electrically connected to the drain interconnection,
   wherein a first holding capacitance is formed by the light-shielding film, the third insulating film and the pixel electrode,
   wherein a second holding capacitance formed by the drain interconnection, the second insulating film and the light-shielding film.

3. A semiconductor device comprising:
   a gate electrode formed over a semiconductor film through a first insulating film and source and drain interconnections connected to the semiconductor film being formed of a same conductive material;
   a gate interconnection formed beneath the semiconductor film, the gate interconnection connected to the gate electrode;
   a second insulting film formed over the source and drain interconnections;
   a light-shielding film formed over the second insulating film;
   a third insulating film formed over the light-shielding film; and
   a pixel electrode formed over the third insulating film, the pixel electrode electrically connected to the drain interconnection,
   wherein a holding capacitance is formed by the light-shielding film, the third insulating film and the pixel electrode.

4. A semiconductor device comprising:
   a gate electrode formed over a semiconductor film through a first insulating film and source and drain interconnections connected to the semiconductor film being formed of a same conductive material;
   a gate interconnection formed beneath the semiconductor film, the gate interconnection connected to the gate electrode;
   a second insulting film formed over the source and drain interconnections;
   a light-shielding film formed over the second insulating film;
   a third insulating film formed over the light-shielding film; and
   a pixel electrode formed over the third insulating film, the pixel electrode electrically connected to the drain interconnection,
   wherein a first holding capacitance is formed by the light-shielding film, the third insulating film and the pixel electrode,
   wherein a second holding capacitance formed by the drain interconnection, the second insulating film and the light-shielding film.

5. A semiconductor device comprising:
   a gate electrode formed over a semiconductor film through a first insulating film and source and drain interconnections connected to the semiconductor film being formed of a same conductive material;
   second and third insulting films formed over the source and drain interconnections;
   a light-shielding film formed on the second and third insulating films;
   a fourth insulating film formed over the light-shielding film; and
   a pixel electrode formed over the fourth insulating film, the pixel electrode electrically connected to the drain interconnection,
   wherein a holding capacitance is formed by the light-shielding film, the fourth insulating film and the pixel electrode.

6. A semiconductor device comprising:
   a gate electrode formed over a semiconductor film through a first insulating film and source and drain interconnections connected to the semiconductor film being formed of a same conductive material;
   second and third insulting films formed over the source and drain interconnections;
   a light-shielding film formed on the second and third insulating films;
   a fourth insulating film formed over the light-shielding film; and a pixel electrode formed over the fourth insulating film, the pixel electrode electrically connected to the drain interconnection, wherein a first holding capacitance is formed by the light-shielding film, the fourth insulating film and the pixel electrodes, wherein a second holding capacitance formed by the drain interconnection, the second insulating film and the light-shielding film.

7. A semiconductor device comprising:

a gate electrode formed over a semiconductor film through a first insulating film and source and drain interconnections connected to the semiconductor film being formed of a same conductive material;

a gate interconnection formed beneath the semiconductor film, the gate interconnection connected to the gate electrode;

second and third insulting films formed over the source and drain interconnections;

a light-shielding film formed on the second and third insulating films;

a fourth insulating film formed over the light-shielding film; and a pixel electrode formed over the fourth insulating film, the pixel electrode electrically connected to the drain interconnection, wherein a holding capacitance is formed by the light-shielding film, the fourth insulating film and the pixel electrode.

8. A semiconductor device comprising:

a gate electrode formed over a semiconductor film through a first insulating film and source and drain interconnections connected to the semiconductor film being formed of a same conductive material;

a gate interconnection formed beneath the semiconductor film, the gate interconnection connected to the gate electrode;

second and third insulting films formed over the source and drain interconnections;

a light-shielding film formed on the second and third insulating films;

a fourth insulating film formed over the light-shielding film; and a pixel electrode formed over the fourth insulating film, the pixel electrode electrically connected to the drain interconnection, wherein a first holding capacitance is formed by the light-shielding film, the fourth insulating film and the pixel electrode, wherein a second holding capacitance formed by the drain interconnection, the second insulating film and the light-shielding film.

9. A semiconductor device according to claim 1, wherein the gate electrode, the source and drain interconnections are formed of an element selected from Ta, W, Ti, Mo, Cu, Cr, Nd and Al, or an alloy material or compound material based on the element.

10. A semiconductor device according to claim 1, wherein the gate electrode, the source and drain interconnections are formed by a semiconductor film introduced with an impurity element.

11. A semiconductor device according to claim 10, wherein the impurity element is one or a plurality of elements selected from n-type-providing elements and p-type-providing elements.

12. A semiconductor device according to claim 1, wherein the gate electrode, the source and drain interconnections are a layered structure.

13. A semiconductor device according to claim 1, wherein the third insulating film is an oxide of the light-shielding film.

14. A semiconductor device according to claim 5, wherein the fourth insulating film is an oxide of the light-shielding film.

15. A semiconductor device having a pixel region and drive circuit on an insulating surface, the semiconductor device comprising:

in a TFT in the pixel region, a first gate electrode formed over a first semiconductor film through a first insulating film and first source and drain interconnections connected to the semiconductor film being formed of a same conductive material;

the first gate electrode being connected to a lower light-shielding film formed by conductive materials, formed beneath the semiconductor film; and a holding capacitance formed by the first gate electrode, an upper light-shielding film formed over the first source and drain interconnections through a second insulating film, a third insulating film formed over the upper light-shielding film, and a pixel electrode formed over the third insulating film and electrically connected to the drain interconnection; and in a TFT in the drive circuit, a second gate electrode formed over a second semiconductor film through a first insulating film and second source and drain interconnections connected to the semiconductor film being formed of a same conductive material; and an interconnection formed of the same material as the lower light-shielding film being connected to the second gate electrode.

16. A semiconductor device according to claim 1, wherein the semiconductor device is a liquid crystal display device.

* * * * *